US012628542B2

(12) United States Patent
Choi et al.

(10) Patent No.: US 12,628,542 B2
(45) Date of Patent: May 12, 2026

(54) DISPLAY DEVICE

(71) Applicant: Samsung Display Co., Ltd., Yongin-Si (KR)

(72) Inventors: Jaewon Choi, Yongin-si (KR); Byoungkyu Park, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 395 days.

(21) Appl. No.: 18/508,241

(22) Filed: Nov. 14, 2023

(65) Prior Publication Data

US 2024/0349582 A1     Oct. 17, 2024

(30) Foreign Application Priority Data

Apr. 13, 2023     (KR) ........................ 10-2023-0048768

(51) Int. Cl.
　　*H10K 59/88*　　　(2023.01)
　　*H10K 59/131*　　(2023.01)
　　*H10K 59/80*　　　(2023.01)
　　*H10K 59/40*　　　(2023.01)
　　*H10K 102/00*　　(2023.01)

(52) U.S. Cl.
　　CPC ........... *H10K 59/88* (2023.02); *H10K 59/131* (2023.02); *H10K 59/8731* (2023.02); *H10K 59/40* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 7,667,397 B2 | 2/2010 | Oh et al. | |
| 9,570,707 B2 | 2/2017 | Son et al. | |
| 10,608,202 B2 | 3/2020 | Choi et al. | |
| 11,223,027 B2 | 1/2022 | Park et al. | |
| 2023/0099550 A1* | 3/2023 | Jung ................... | H10K 59/873 257/211 |

FOREIGN PATENT DOCUMENTS

| | | |
|---|---|---|
| KR | 10-0647339 B1 | 11/2006 |
| KR | 10-0716908 B1 | 5/2007 |
| KR | 10-2017-0127603 A | 11/2017 |
| KR | 10-1885821 B1 | 9/2018 |
| KR | 10-1976832 B1 | 5/2019 |

* cited by examiner

*Primary Examiner* — Kyoung Lee
(74) *Attorney, Agent, or Firm* — Innovation Counsel LLP

(57) ABSTRACT

A display device according to an embodiment includes a substrate including a display area and a non-display area. The substrate has a bend in the non-display area. Moisture-sensitive components such as a data driver and a pad unit are also in the non-display area. A dummy pattern unit is between the bend and the moisture-sensitive components, and an inspection circuit unit positioned is between the dummy pattern unit and the moisture-sensitive components. The dummy pattern unit and the inspection circuit may reduce a flow of moisture from the bend to the moisture sensitive components.

20 Claims, 17 Drawing Sheets

|  | data driving part | bending region |
|---|---|---|
| 0hr | 17% oxidation | 20% oxidation |
| 240hr | 31% oxidation | 53% oxidation |
| 500hr | 47% oxidation | 100% oxidation |

DISPLAY DEVICE

CROSS-REFERENCE TO RELATED APPLICATION

This application claims priority to and the benefit of Korean Patent Application No. 10-2023-0048768 filed at the Korean Intellectual Property Office on Apr. 13, 2023, the entire contents of which are incorporated herein by reference.

BACKGROUND

(a) Field of the Invention

Embodiments of the present disclosure relate to a display device, and more particularly, to a display device having improved reliability.

(b) Description of the Related Art

A display device is a device that is capable of displaying images. A display device typically includes a screen such as a liquid crystal display (LCD), an organic light emitting diode display (OLED), or the like. Such display devices are commonly used in electronic devices such as mobile phones, navigation devices, digital cameras, electronic books, portable game consoles, and terminals.

SUMMARY

Embodiments disclosed herein may provide a display device that prevents moisture from flowing through a dummy pattern into a data driver, a pad unit, or a test circuit unit of the display device.

A display device according to an embodiment may include a substrate having a display area and a non-display area. The non-display area may include a bend. The non-display area may also include one or more moisture-sensitive components such as a data driver, a pad portion and a flexible circuit board connected to the pad portion. A dummy pattern unit may be disposed between the moisture-sensitive components and the bend, and a test or inspection circuit unit may be positioned between the dummy pattern unit and the moisture-sensitive components.

In the display area, a semiconductor layer disposed on the substrate, a first conductive layer including a gate electrode overlapping the semiconductor layer, a second conductive layer including a drain electrode electrically connected to the semiconductor layer, and a third conductive layer including a connection electrode electrically connected to the drain electrode may be positioned.

The dummy pattern unit may include a first dummy pattern positioned on the same layer as the second conductive layer.

The dummy pattern unit may include a second dummy pattern positioned on the same layer as the third conductive layer.

Edges of the first dummy pattern and the second dummy pattern may be aligned.

The first dummy pattern and the second dummy pattern may be alternately disposed.

The display device may further include a first insulating layer positioned between the first conductive layer and the second conductive layer, a second insulating layer positioned between the second conductive layer and the third conductive layer, and a third insulating layer positioned on the third conductive layer.

The second insulating layer may be recessed between sections of the first dummy pattern.

The third insulating layer may be recessed between sections of the first dummy pattern.

The third insulating layer may be recessed between sections of the second dummy pattern.

At least one of the second insulating layer and the third insulating layer includes a first portion overlapping the first and/or second dummy pattern and having a first thickness, and a second portion spaced apart from the first or second dummy pattern and having a second thickness. And the first thickness may be smaller than the second thickness.

The inspection circuit unit may include a first inspection circuit unit including a static electricity discharge unit.

The first inspection circuit unit may include a first static electricity discharge line and a second static electricity discharge line, and different voltages may be applied to the first static electricity discharge line and the second static electricity discharge line.

The inspection circuit unit may further include a second inspection circuit unit including a plurality of lighting lines and a third inspection circuit unit including a plurality of crack detection lines.

The first inspection circuit unit, the second inspection circuit unit, and the third inspection circuit unit may be positioned away from the display area in that order.

The first static electricity discharge line and the second static electricity discharge line may be positioned on the same layer as the second conductive layer.

The plurality of lighting lines and the plurality of crack detection lines may be positioned on the same layer as the second conductive layer.

In a portion where the substrate is bent, an organic insulating layer may be positioned at an outermost portion.

A separate voltage may not be applied to the dummy pattern unit.

A scan line extending in a first direction and a data line extending in a second direction may be positioned in the display area, and sections of the first dummy pattern and the second dummy pattern may extend along the first direction.

According to the embodiments, since moisture is prevented from flowing into moisture-sensitive components such as the data driver, the pad unit, or the inspection circuit unit through the dummy pattern, a display device with improved reliability can be provided.

BRIEF DESCRIPTION OF THE DRAWINGS

FIG. 8 is a cross-sectional view illustrating a non-display area according to an embodiment.

FIG. 13, FIG. 14, FIG. 15, FIG. 16, and FIG. 17 show experimental results indicating effects of moisture on display device embodiments.

DETAILED DESCRIPTION OF THE EMBODIMENTS

Figure 1:
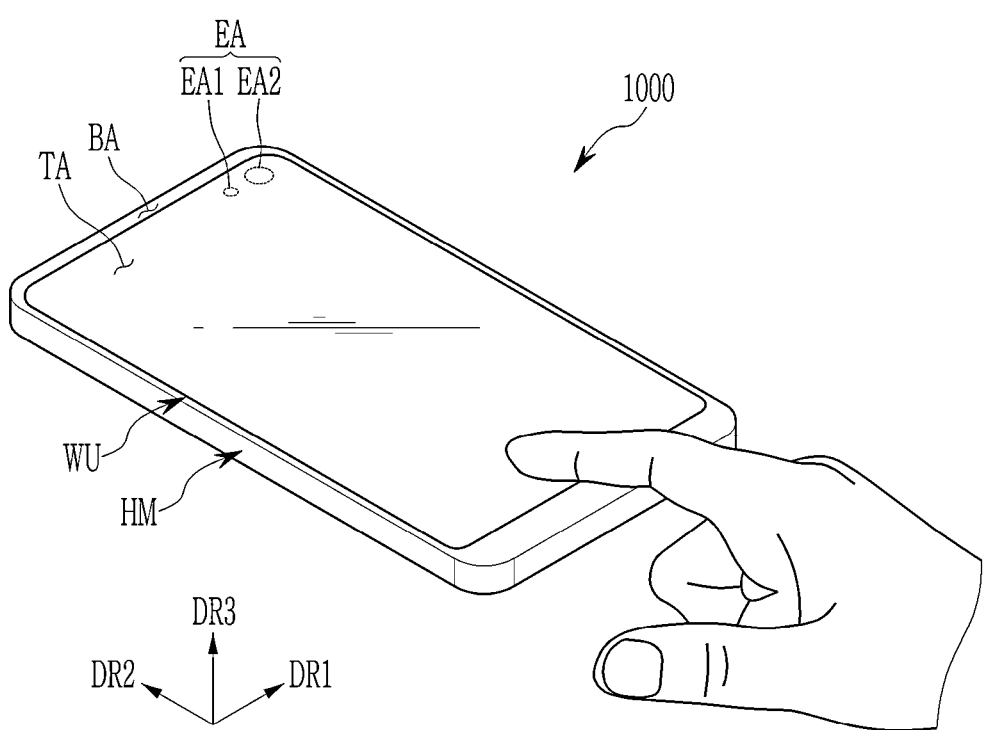
FIG. 1 is a schematic perspective view of a display device according to an embodiment.

Embodiments of the present disclosure are described in detail with reference to the accompanying drawings. The invention as set forth in the claims may be embodied in many different forms and is not limited to the embodiments set forth herein.

In order to clearly describe the example embodiments, parts irrelevant to the description are omitted, and the same reference numerals may be assigned to the same or corresponding constituent elements throughout the specification and the drawings.

In addition, the size and thickness of each component in the drawings are shown for convenience of explanation, and embodiments are not necessarily limited to the relative proportions, sizes, and thicknesses shown in the drawings. In the drawings, thicknesses of layers or regions may be enlarged or exaggerated to clearly illustrate the various layers and regions and for convenience of explanation.

In addition, when a part such as a layer, film, region, plate, etc. is said to be "above" or "on" another part, this includes not only the case where the part is "directly on" the other part, but also the case where yet another part intervenes. In contrast, when a part is referred to as being "directly on" another part, no intervening parts are present.

In addition, being "above" or "on" a reference part indicates positioning relative to the reference part and does not necessarily mean being positioned "above" or "on" relative to a direction of gravity.

In addition, unless explicitly described to the contrary, the word "comprise," and variations such as "comprises" or "comprising" should be understood to imply the inclusion of stated elements but not the exclusion of any other elements.

Also, throughout the specification, reference to a "planar image" or a "plan view" means the target part is viewed from above an area of the target part, and reference to a "cross-sectional image" or "cross-sectional view" means the target part is cut and the cut surface is shown or viewed.

Figure 2:
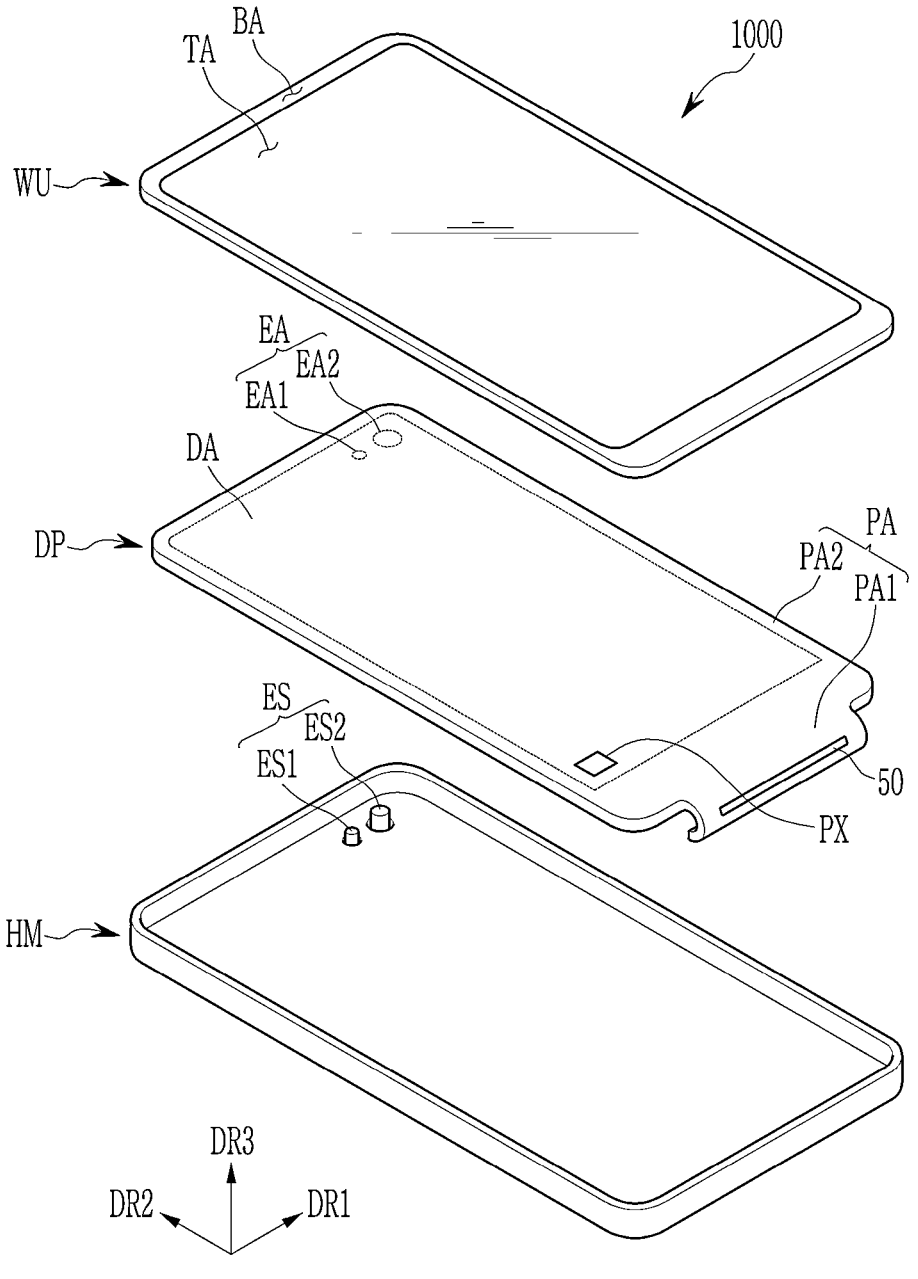
FIG. 2 is an exploded perspective view of a display device according to an embodiment.
Figure 3:
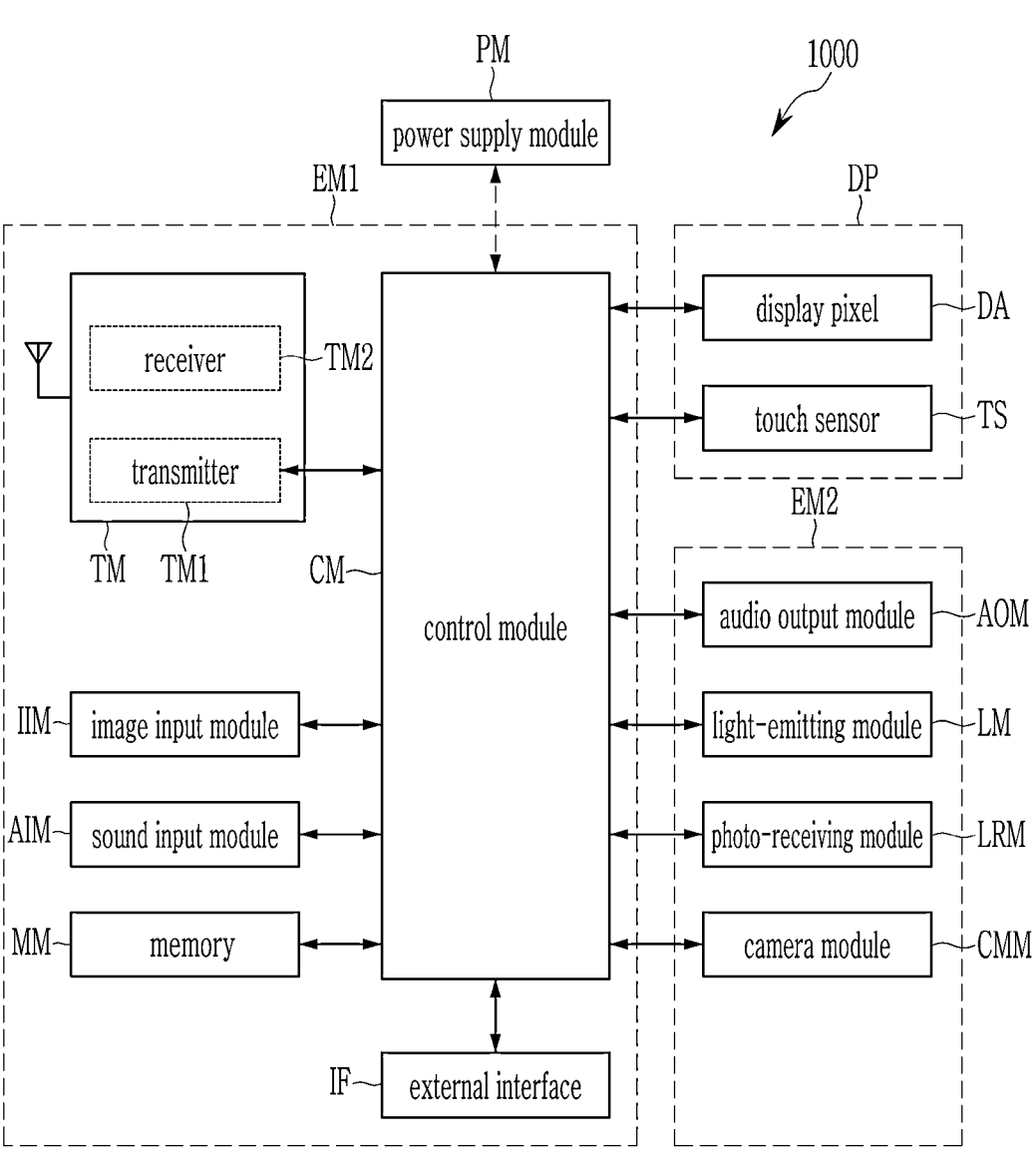
FIG. 3 is a block diagram of a display device according to an embodiment.

Hereinafter, a schematic structure of a display device (1000) is described with reference to FIG. 1 to FIG. 3. FIG. 1 is a schematic perspective view illustrating a use state of the display device (1000) according to an embodiment, FIG. 2 is an exploded perspective view of the display device (1000) according to an embodiment, and FIG. 3 is a block diagram of the display device (1000) according to an embodiment.

Referring to FIG. 1, the display device (1000) according to an embodiment is a device for displaying a moving image or a still image, and the display device (1000) may be a portable device such as a mobile phone, a smart phone, a tablet personal computer (PC) a communication terminal, an electronic notebook, an e-book, a portable multimedia player (PMP), a navigation device, or an ultra-mobile PC (UMPC), but embodiments disclosed herein are not limited to portable electronic devices. Other embodiments could be, for example, televisions, laptops, monitors, billboards, Internet of things (IOT), or any other products employing display screens. In some other embodiments, the display device 1000 may be used in a wearable device, such as a smart watch, a watch phone, an eyewear display, and a head mounted display (HMD). In other embodiments, the display device (1000) could be in a dashboard of a vehicle, a center information display (CID) disposed on a center fascia or dashboard of a vehicle, and a room mirror display replacing a side mirror of a vehicle, entertainment for the back seat of a car, or a display placed on the back of the front seat of a vehicle. For convenience of explanation, the following description assumes that the display device (1000) is a smart phone.

The display device (1000) may display an image on a display surface parallel to each of the first and second directions (DR1) and (DR2), and the image may be viewable from a third direction (DR3). The display surface on which the image is displayed may correspond to the front surface of the display device (1000) and may particularly correspond to the front surface of the cover window (WU) of the display device (1000). The image displayed may a still image or a dynamic image, e.g., video.

For the illustrated embodiment, the front (or upper surface) and rear surface (or lower surface) of each member are defined based on the direction in which the image is viewed. The front surface and the rear surface oppose each other in the third direction (DR3), and a normal direction of each of the front surface and the rear surface may be parallel to the third direction (DR3). The separation distance between the front and rear surfaces in the third direction (DR3) may correspond to the thickness of the display device (1000) in the third direction (DR3).

The display device (1000) according to an embodiment may detect a user's input (refer to a hand shown in FIG. 1) applied from the outside. The user's input may correspond to various types of external inputs such as a part of the user's body, light, heat, or pressure being applied to the display device (1000). In the illustrated embodiment, the user's input is shown as the user's hand being applied in the foreground. However, the present invention is not limited thereto.

A user's input may be provided in various forms, and the display device (1000) may detect a user's input applied to the front, side, or rear surface of the display device (1000) according to the structure of the display device (1000).

Referring to FIG. 1 and FIG. 2, the display device (1000) may include a cover window (WU), a housing (HM), a display panel (DP), and an element (ES). In an embodiment, the cover window (WU) and the housing (HM) may be combined to form the exterior of the display device (1000).

The cover window (WU) may include an insulating panel. For example, the cover window (WU) may be made of glass, plastic, or a combination thereof. The front surface of the cover window WU may define the front surface of the display device (1000).

A transmission region (TA) of the cover window (WU) may be an optically transparent region. For example, the transmission region (TA) may have a visible light transmittance of about 90% or more.

A blocking region (BA) of the cover window (WU) may define the shape of the transmission region (TA). The blocking region (BA) may be adjacent to the transmission region (TA) and may surround the transmission region (TA). The blocking region (BA) may have relatively low light transmittance compared to the transmission region (TA) and may have a color chosen for ascetics or function. The blocking region (BA) may include an opaque material that blocks light. The blocking region (BA) may be defined by a bezel layer provided separately from the transparent substrate defining the transmission region (TA) or may be defined by an ink layer on or colored in the transparent substrate.

The housing (HM) may be coupled to the cover window (WU). The cover window (WU) may be disposed on the front surface of the housing (HM). The housing (HM) may be coupled to the cover window (WU) to provide a predetermined accommodation space surrounded by the housing (HM) and the cover window (WU). The display panel (DP) and the element (ES) may be accommodated in the predetermined accommodation space provided between the housing (HM) and the cover window (WU).

The housing (HM) may include a material with relatively high rigidity. For example, the housing (HM) may include a plurality of frames and/or plates made of glass, plastic, or metal, or a combination thereof. The housing (HM) can stably protect from external impact the components of the display device (1000) accommodated in the inner space.

The display panel (DP) displays an image and may include a front surface including a display area (DA) and a non-display area (PA). The display panel (DP) may further include a data driver (50) in the non-display area (PA) as shown in FIG. 2.

The display area (DA) may be a region where pixels operate according to electrical signals to emit light. In an embodiment, the display area (DA) may be a region including pixels and displaying an image and may also be a region where a touch sensor is positioned above the pixel in the third direction (DR3) to detect an external input.

In the display area (DA), a plurality of light emitting elements and a plurality of pixel circuit units generating and transmitting a light emitting current to each of the plurality of light emitting elements are disposed. Here, a light emitting element and a pixel circuit unit are referred to as a pixel (PX). In the display area (DA), one pixel circuit unit generally corresponds to one light emitting element.

The transmission region (TA) of the cover window (WU) may at least partially overlap the display area (DA) of the display panel (DP). For example, the transmission region (TA) may overlap the entire surface of the display area (DA) or may overlap at least a portion of the display area (DA). Accordingly, the user may view the image through the transmission region (TA) or provide an external input based on the image. However, embodiments are not limited thereto. For example, within the display area (DA), a region where an image is displayed and a region where an external input is sensed may be separated from each other.

The non-display area (PA) of the display panel (DP) may at least partially overlap the blocking region (BA) of the cover window (WU). The non-display area (PA) may be a region covered by the blocking region (BA). The non-display area (PA) is adjacent to the display area (DA) and may surround the display area (DA).

An image is not displayed in the non-display area (PA), and a driving circuit or a driving wire for driving the display area (DA) may be disposed in the non-display area (PA). In the illustrated embodiment, the non-display area (PA) includes a first non-display area (PA1) and a second non-display area (PA2). The first non-display area (PA1) includes the data driver (50), connection wires, and a bending region The second non-display area (PA2) borders the display area (DA). In the embodiment of FIG. 2, the second non-display area (PA2) is positioned on three sides of the display area (DA), which is substantially rectangular, and the first non-display area (PA1) is positioned on the remaining side of the rectangular display area (DA).

In an embodiment, a portion of the non-display area (PA) or specifically a portion of the second non-display area (PA2) of the display panel (DP) may be bent. With a 180° bend, a part of the non-display area (PA) faces the rear surface of the display device (1000), so that the blocking region (BA) visible on the front of the display device (1000) can be reduced. In FIG. 2, the first non-display area (PA1) is bent and may be fully or partially positioned behind or on the rear surface of the display area (DA).

The display panel (DP) may further include an element region (EA), and specifically, a first element region (EA1) and a second element region (EA2). The first element region (EA1) and the second element region (EA2) may be at least partially surrounded by the display area (DA). The first element region (EA1) and the second element region (EA2) are illustrated as being spaced apart from each other but are not limited thereto and may be connected at least in part. Components using infrared rays, visible rays, or sound may be disposed below the first element region (EA1) and the second element region (EA2). For example, the element (ES) may be below the elemental region (EA).

The first element region (EA1) may include a region of a transparent layer through which light can pass, and a conductive layer, a semiconductor layer, and a pixel definition layer including a light blocking material, a light blocking layer, etc., are not positioned in the first element region (EA1). For example, A pixel definition layer may include an opening overlapping the position corresponding to the first element region (EA1), so that the first element region (EA1) can have a structure that does not block light.

The second element region (EA2) may include a transmission unit and a display unit. The transmission unit is a structure through which light or/and sound may pass, and the display unit may include a plurality of pixels. The transmission unit may be positioned between adjacent pixels or interwoven among the pixels and may be composed of a transparent layer which light or/and sound can pass. In an embodiment, the display unit may include sets of pixels that are grouped together or are combined to form unit structures, each unit structure containing a plurality of pixels, and a transmission unit may be positioned between adjacent unit structures.

The display area (DA) and the second non-display area (PA2) may have a flat state in which the display area DA and the second non-display area are substantially parallel to a plane defined by the first and second directions (DR1) and (DR2), and the first non-display area (PA1) may include a flat region extending from the display area (DA) and a bending region extending from the flat region of the first non-display area (PA1). As a result, at least a portion of the first non-display area (PA1) may be bent and positioned on or behind the rear side of the display area (DA). Since at least a portion of the first non-display area (PA1) overlaps the display area (DA), the blocking region (BA) of the display device (1000) may be smaller.

The data driver (50) may be mounted on the first non-display area (PA1) and may be mounted between the bending area and an end of the display panel (DP). The data driver (50) may include an integrated circuit chip. The data driver (50) may be electrically connected to the display area (DA) to transmit an electrical signal to the display area (DA). For example, the data driver (50) may provide data signals to the pixels (PX) disposed in the display area (DA). Alternatively or additionally, the data driver (50) may include a touch driving circuit and may be electrically connected to a touch sensor disposed in the display area (DA). The data driver (50) may further include various circuits in addition to the above-mentioned circuits or may provide various electrical signals to the display area (DA).

A pad unit may be positioned at an end of the first non-display area (PA1) in the display device (1000) and may be electrically connected to a flexible printed circuit board (FPCB) including a driving chip by the pad unit. Here, the driving chip positioned on the flexible printed circuit board may include various driving circuits for driving the display device (1000) or connectors for supplying power. According to some embodiments, a rigid printed circuit board (PCB) may be used instead of a flexible printed circuit board.

The element (ES) may be disposed below the display panel (DP). The element (ES) may include a first element (ES1) overlapping the first element region (EA1) and a second element (ES2) overlapping the second element region (EA2).

The first element (ES1) may be an electronic element using light or sound. For example, the first element (ES1) may be a sensor such as an infrared sensor that receives and uses light, a sensor that outputs and senses light or sound to measure a distance, a sensor for fingerprint recognition, or a small lamp that outputs light. The element (ES1) may alternatively be a speaker or the like that outputs sound. In the case of an electronic element using light, light of various wavelength bands such as visible light, infrared light, and ultraviolet light can be used.

The second element (ES2) may include at least one of a camera, an IR camera, a dot projector, an IR illuminator, and a time-of-flight sensor (ToF sensor).

Referring to FIG. 3, the display device (1000) may include a display panel (DP), a power supply module (PM), a first electronic module (EM1), and a second electronic module (EM2). The display panel (DP), the power supply module (PM), the first electronic module (EM1), and the second electronic module (EM2) may be electrically connected to each other.

FIG. 3 illustrates a display pixel and a touch sensor (TS) positioned in the display area (DA) among the components of the display panel (DP).

The power supply module (PM) may supply power required for overall operation of the display device (1000). The power supply module (PM) may include a conventional battery module.

The first electronic module (EM1) and the second electronic module (EM2) may include various functional modules for operating the display device (1000).

The first electronic module (EM1) may include a control module (CM), a wireless communication module (TM), an image input module IIM, an audio input module (AIM), a memory (MM), and an external interface (IF). The first electronic module (EM1) may be directly mounted on a motherboard electrically connected to the display panel (DP) or may be mounted on a separate board and electrically connected to the motherboard through a connector (not shown). Some of the modules may not be mounted on the motherboard and may be electrically connected to the motherboard through a flexible printed circuit board connected thereto.

The control module (CM) may be a microprocessor and may control overall operations of the display device (1000). For example, the control module (CM) may activate or deactivate the display panel (DP). The control module (CM) may control other modules such as the image input module (IIM) or the audio input module (AIM) based on the touch signal received from the display panel (DP).

The wireless communication module (TM) can transmit/receive radio signals with other terminals using a Bluetooth or Wi-Fi line. The wireless communication module (TM) may transmit/receive voice signals using a general communication line or protocol. The wireless communication module (TM) includes a transmitter (TM1) for modulating and transmitting a signal to be transmitted, and a receiver (TM2) for demodulating a received signal.

The image input module (IIM) may process the image signal and convert it into image data that can be displayed on the display panel (DP).

The audio input module (AIM) may receive an external sound signal and may include a microphone that converts the sound signal into electrical data for use of the display device (1000) in a recording mode, a voice recognition mode, or the like.

The external interface (IF) may serve as an interface for connection to an external charger, a wired/wireless data port, a card socket (e.g., a memory card, a SIM/UIM card), and the like.

The second electronic module (EM2) may include an audio output module (AOM), a light emitting module (LM), a light receiving module (LRM), and a camera module (CMM), at least some of which are elements (ES), which as shown in FIG. 2 may be positioned on the rear surface of the display panel (DP). The element (ES) may particularly include a light emitting module (LM), a light receiving module (LRM), and a camera module (CMM). The second electronic module (EM2) may be directly mounted on the motherboard, mounted on a separate board and electrically connected to the display panel (DP) through a connector (not shown), or connected to the first electronic module (EM1).

The audio output module (AOM) may convert audio data received from the wireless communication module (TM) or audio data stored in the memory (MM) and may output the converted audio data to the outside.

The light emitting module (LM) may generate and output light. The light emitting module (LM) may particularly output infrared rays. In an embodiment, the light emitting module (LM) may include a light emitting diode (LED) element.

The light receiving module (LRM) may detect light and may particularly detect infrared rays. The light receiving module (LRM) may be activated when infrared rays of a predetermined level or higher are detected. In an embodiment, the light receiving module (LRM) may include a CMOS sensor.

In an embodiment, infrared light generated by the light emitting module (LM) may be output and then reflected by an external subject (e.g., a user's finger or face), and the reflected infrared light may be incident to the light receiving module (LRM).

The camera module (CMM) may capture an external image.

In an embodiment, the element (ES) may additionally include a light detection sensor or a heat detection sensor. The element (ES) may detect an external subject using light or sound received through the front surface or provide a sound signal such as voice to the outside through the front surface. Also, the element (ES) may include a plurality of elements and is not limited to an embodiment.

Hereinafter, the structure of the display panel (DP) will be reviewed, and first, the structure of the display panel (DP) will be reviewed in detail with reference to FIG. 4 and FIG. 5.

Figure 4:
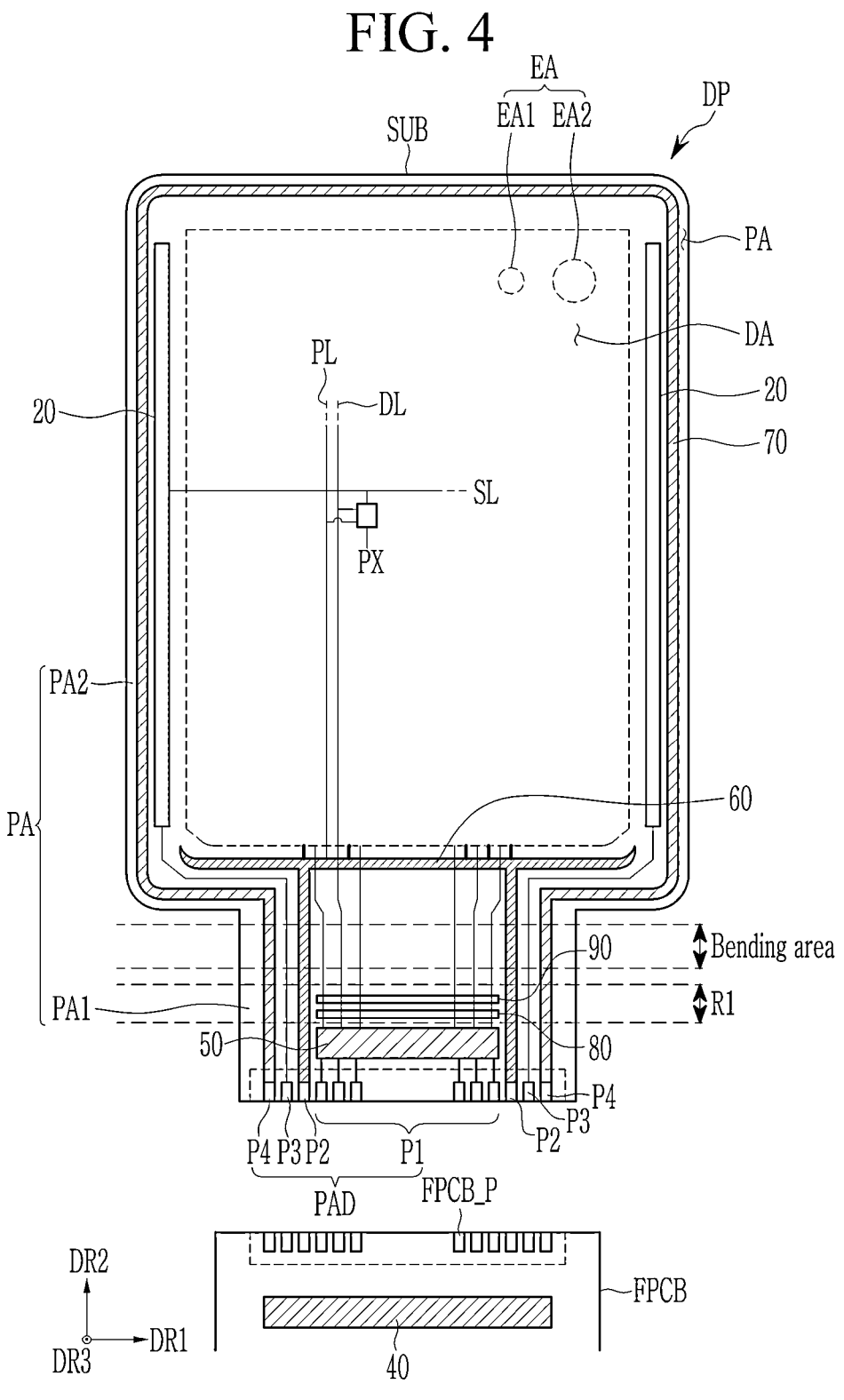
FIG. 4 is a top plan view illustrating some components of a display panel according to an embodiment.
Figure 5:
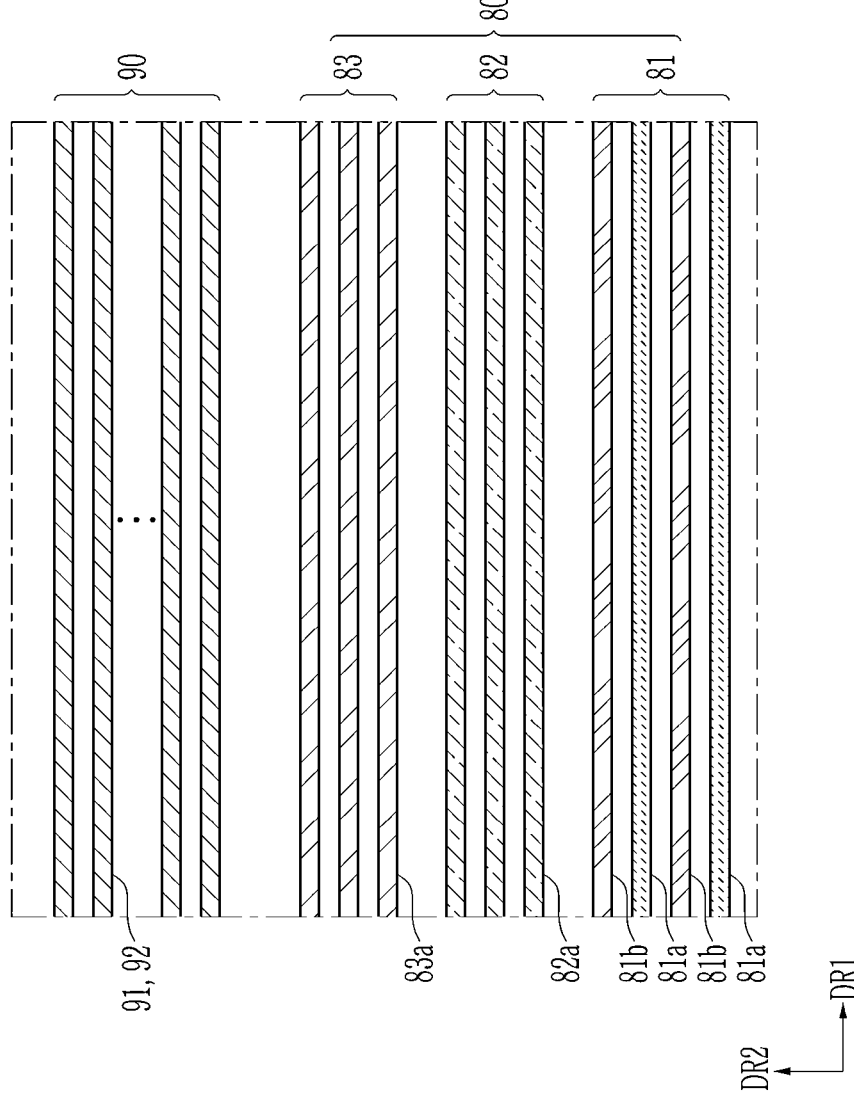
FIG. 5 is an enlarged top plan view of a portion of FIG. 4.

FIG. 4 is a top plan view illustrating some constituent elements of a display panel according to an embodiment, and FIG. 5 is an enlarged plan view of a portion of FIG. 4.

Referring to FIG. 4, the display panel (DP) may include a display area (DA), an element region (EA), and a non-display area (PA)

The non-display area (PA) can define an edge of the display area (DA). The non-display area (PA) may include a first non-display area (PA1) including the data driver (50), connection wires, and a bending region, and a second non-display area (PA2) outside the display area (DA).

The display panel (DP) includes a plurality of pixels (PX). A plurality of pixels (PX) may be in the display area (DA). Each of the pixels (PX) may include a light emitting element and a pixel circuit unit connected thereto. Each pixel (PX) may include, for example, an organic light emitting diode, and may emit light of a color, for example, red, green, blue, or white light, associated with the pixel (PX).

The display panel (DP) may further include a plurality of signal lines and a pad unit. The plurality of signal lines may include scan lines (SL) extending in the first direction (DR1), data lines (DL) and driving voltage lines (PL) extending in the second direction (DR2), and the like.

A scan driver (20) is positioned on the left and right sides of the display area (DA) in the embodiment of FIG. 4, and the scan driver (20) generates and transmits a scan signal to each pixel (PX) through a scan line (SL). The pixels (PX) may receive scan signals from the two scan drivers (20) positioned on the left and right sides of the display panel.

The pad unit (PAD, hereinafter also referred to as a circuit board pad unit) is disposed at an end of the first non-display area (PA1) of the display panel (DP) and may include a plurality of pads (P1, P2, P3, P4). The pad unit (PAD) may be exposed without being covered by the insulating layer and may be electrically connected to the flexible printed circuit board (FPCB). The pad unit (PAD) may particularly be electrically connected to the pad unit (FPCB_P) of the flexible printed circuit board (FPCB).

The flexible printed circuit board (FPCB) may transfer signals or power from the IC driving chip (40) to the pad unit (PAD). The IC driving chip (40) changes a plurality of video signals transmitted from the outside into a plurality of video data signals and transfers the changed signals to the data driver (50) through the pad (P1). In addition, the IC driving chip (40) receives the vertical synchronization signal, the horizontal synchronization signal, and the clock signal to generate control signals for controlling the driving of the scan driver (20) and the data driver (50). The IC driving chip (40) may pass the clock signal to each of pads (P3) and (P1).

The IC driving chip (40) transfers the driving voltage (ELVDD) to the driving voltage supply line (60) through the pad (P2). Also, the IC driving chip (40) may transmit the common voltage (ELVSS) to each of the common voltage supply lines (70) through the pad (P4).

The data driver (50) is disposed on the first non-display area (PA1), generates a data voltage to be applied to each pixel (PX), and transfers the data voltage to each data line (DL). The data driver (50) may be disposed on one side of the display panel (DP) and may be disposed between, for example, the pad unit (PAD) and the display area (DA).

The data lines (DL) connect to pixels (PX) except for the pixels (PX) positioned on the upper and lower sides of the element region (EA) along the second direction (DR2) and may be straight lines that extend along the second direction (DR2)s. In contrast, the data lines (DL) connected to the pixels (PX) positioned at the upper and lower sides of the element region (EA) extend along the second direction (DR2) and also include a portion extending along the periphery of the element region (EA).

The driving voltage supply line (60) is disposed on the first non-display area (PA1). For example, the driving voltage supply wire (60) may be disposed between the data driver (50) and the display area (DA). The driving voltage supply line (60) provides the driving voltage (ELVDD) to the pixels (PX). The driving voltage supply wire (60) extends in the first direction (DR1) and may be connected to a plurality of driving voltage lines (PL) that extend in the second direction (DR2).

The common voltage supply line (70) is disposed on the first non-display area (PA1). The common voltage supply wire (70) may have a shape surrounding the substrate (SUB). The common voltage supply line (70) transfers the common voltage (ELVSS) to an electrode (e.g., cathode) of a light emitting element included in the pixel (PX).

An inspection circuit unit (80) may be positioned between the data driver (50) and the display area (DA). In an embodiment, the inspection circuit unit (80) is positioned in the first non-display area (PA1) below the display area (DA) and particularly in a region (R1) between the bending area and the display driver (50). Referring to FIG. 4 and FIG. 5, the inspection circuit unit (80) may include a first inspection circuit unit (81), a second inspection circuit unit (82), and a third inspection circuit unit (83). The third inspection circuit unit (83), the second inspection circuit unit (82), and the first inspection circuit unit (81) may be arranged in this order from closest to furthest from the display area (DA).

The inspection circuit unit (80) may be formed on the substrate (SUB) together with a plurality of signal lines and switching elements positioned in the display area (DA). The inspection circuit unit (80) may be electrically connected to the display area (DA), the data driver (50) and/or the pad unit (PAD) through the plurality of wires (81a, 81b, 82, 83).

The first inspection circuit unit (81) according to an embodiment may be a static electricity discharge unit. Static electricity may flow in from the outside, and if not discharged, the static electricity may destroy elements within the display area (DA). Static electricity inflowing through the plurality of static electricity discharge lines (81a, 81b) included in the first inspection circuit unit (81) may be discharged.

The first inspection circuit unit (81) may include a first static electricity discharge line (81a) and a second static electricity discharge line (81b). A first voltage may be applied to the first static electricity discharge line (81a), and a second voltage may be applied to the second static electricity discharge line (81b). According to an embodiment, static electricity having a positive voltage introduced into the display panel (DP) is discharged through the first static electricity discharge line (81a), and static electricity having a negative voltage is discharged through the second static electricity discharge line (81b).

The first electrostatic discharge line (81a) and the second electrostatic discharge line (81b) may include the same material as the source and drain electrodes of transistors in the pixel circuits in the display area (DA) and may be positioned on the same layer as the source and drain electrodes. The first static electricity discharge line (81a) and the second static electricity discharge line (81b) may be positioned on the same layer as a second conductive layer. The first static electricity discharge line (81a) and the second static electricity discharge line (81b) may be formed in the same process as forming the source and drain electrodes of the display area (DA).

The second inspection circuit unit (82) may include a plurality of lighting lines (82a). The plurality of lighting lines (82a) may be connected to the data lines (DL), so that the lighting state of the display area (DA) may be inspected and confirmed using the second inspection circuit (82). The plurality of lighting lines (82*a*) may include the same material as the source and drain electrodes of transistors formed in the display area (DA) and may be positioned on the same layer as the source and drain electrodes. The plurality of lighting lines (82*a*) may be positioned on the same layer as the second conductive layer, and the lighting lines (82*a*) may be formed in the same process as forming the source and drain electrodes of the display area (DA).

The third inspection circuit unit (83) may include a plurality of crack detection lines (83*a*). The crack detection line (83*a*) may be electrically connected to at least one of the plurality of data lines (DL). For example, a crack detection line (83*a*) may be connected to the data line (DL) adjacent to the edge of the display area (DA)—in particular, adjacent to the element region (EA) to detect a crack in the vicinity of the element region (EA) or the edge of the display area (DA). In particular, a crack in an area adjacent to the non-display area (PA) may be sensed by being connected to the data line (DL).

A dummy pattern unit (90) may be positioned between the inspection circuit unit (80) and the display area (DA) as shown in FIG. 4. As shown in FIG. 5, the dummy pattern unit (90) may include a plurality of dummy patterns (91, 92). Each of the dummy patterns (91, 92) may have sections extending along the first direction (DR1). Also, sections of dummy patterns (91, 92) may be spaced apart from each other along the second direction (DR2). The number of dummy patterns (91, 92) and the number of sections in each dummy pattern (91,92) may be selected according to the area of the first non-display area (PA1), the width of the dummy patterns (91, 92), and the like. The dummy patterns (91, 92) may particularly include a first dummy pattern (91) and a second dummy pattern (92) positioned on different layers. A specific cross-sectional structure is described below with reference to FIG. 9 to FIG. 12.

A voltage is not applied to the dummy pattern unit (90) and the dummy pattern unit (90) may be in a floating state.

The third inspection circuit unit (83) may be positioned closest to the dummy pattern unit (90). In this case, the plurality of crack detection lines (83*a*) included in the third inspection circuit unit (83) and the first dummy pattern (91) included in the dummy pattern unit (90) may be positioned on the same layer.

Static electricity failure is not generated by the plurality of crack detection lines (83*a*), and therefore, additional static electricity failure may not be generated even by the dummy pattern unit (90) disposed on the same layer and adjacent to each other.

The first non-display area (PA1) may include a bending area. The bending area may be positioned between the display area (DA) and the dummy pattern unit (90). To facilitate bending, one or more inorganic layers may be removed in a bending area. Additionally or alternatively, an inorganic layer that is in other parts of the display panel (DP) may not be included in the bending area. An insulating layer made of an organic material may be positioned in the bending area. For example, an insulating layer made of an organic material may be positioned at the outermost part of the bending area.

External moisture may flow into the bending area, and the introduced moisture may move to the test circuit unit (80), the data driver (50), or the pad unit (PAD) along an insulating layer made of an organic material. Moisture introduced from the bending area may oxidize an inorganic layer covering the first non-display area (PA1) and cause corrosion of the device. However, the dummy pattern unit (90) according to an embodiment increases the length of the path through which the introduced moisture moves, thereby delaying the movement of the moisture to the inspection circuit unit (80), the data driver (50), or the pad unit (PAD). According to this, oxidation of the inorganic layer disposed in the non-display area can be prevented, and reliability of the display device can be improved.

Figure 6:
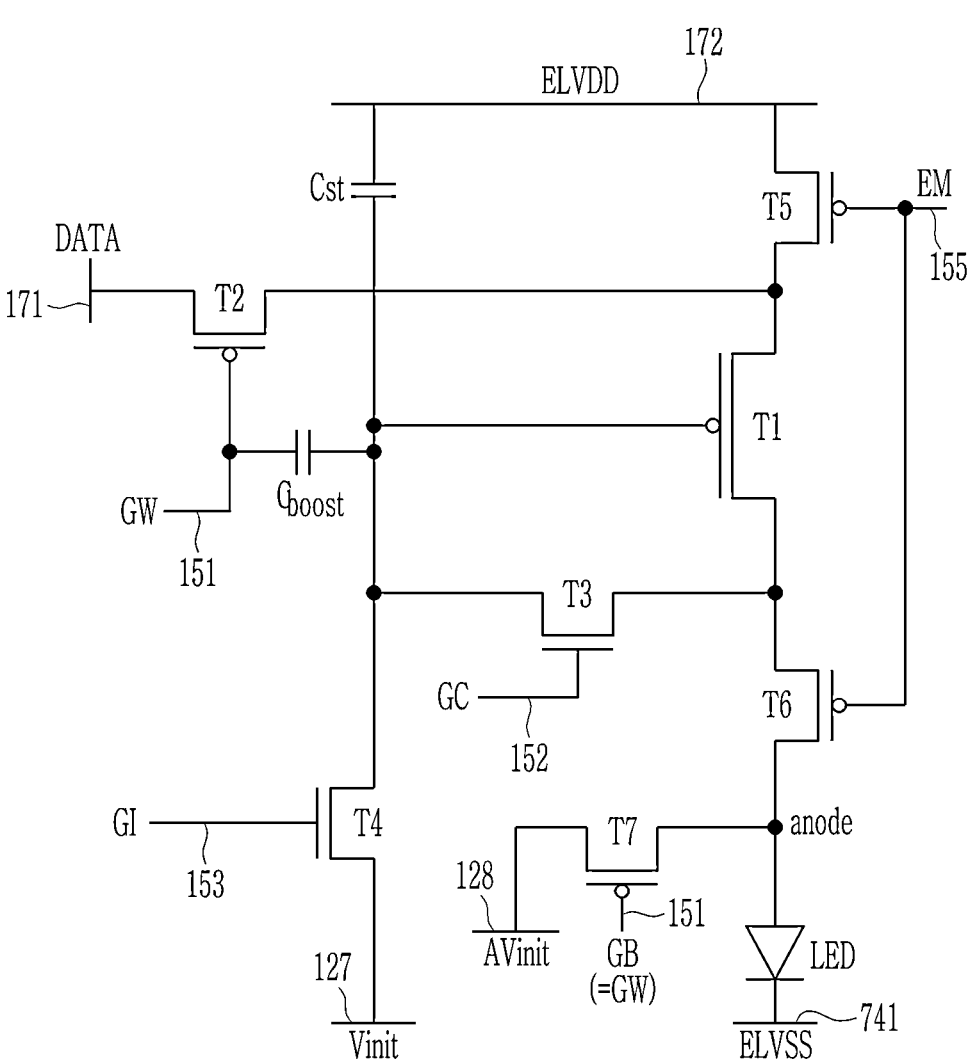
FIG. 6 is a circuit diagram of a pixel that may be included in a display panel according to an embodiment.

Hereinafter, an example of the circuit structure of the pixel (PX) positioned on the aforementioned display panel (DP) will be described with reference to FIG. 6. FIG. 6 is a circuit diagram of one pixel included in a display panel according to an embodiment. The circuit structure shown in FIG. 6 may be a circuit structure of a pixel circuit unit and a light emitting element formed in parts of the display area (DA) and the element region (EA).

One pixel according to the illustrated embodiment includes a plurality of transistors (T1, T2, T3, T4, T5, T6, T7) connected to various wires (127, 128, 151, 152, 153, 155, 171, 172, 741), a storage capacitor (Cst), a boost capacitor ($C_{boost}$), and a light emitting element (LED). Here, a pixel circuit includes the transistors and capacitors but non the light emitting element (LED). Depending on embodiments, the boost capacitor ($C_{boost}$) may be omitted.

The wires (127, 128, 151, 152, 153, 155, 171, 172, 741) are connected to one pixel (PX) include a first initialization voltage line (127), a second initialization voltage line (128), a first scan line (151), a second scan line (152), an initialization control line (153), an emission control line (155), a data line (171), a driving voltage line (172), and a common voltage line (741).

Although the first scan line (151) connected to the seventh transistor (T7) is also connected to the second transistor (T2) in FIG. 6, in some alternative embodiments, the seventh transistor (T7) may be connected with a bypass control line. The first scan line (151) is connected to a scan driver (not shown in FIG. 6) to transmit the first scan signal (GW) to the second transistor (T2) and the seventh transistor (T7).

A voltage of opposite polarity to that applied to the first scan line (151) may be applied to the second scan line (152) at the same time as the signal of the first scan line (151). For example, when a voltage of negative polarity is applied to the first scan line (151), a voltage of positive polarity may be applied to the second scan line (152). The second scan line (152) transfers the second scan signal (GC) to the third transistor (T3).

The initialization control line (153) transfers the initialization control signal (GI) to the fourth transistor (T4).

The emission control line (155) transmits the emission control signal (EM) to the fifth transistor (T5) and the sixth transistor (T6).

The data line (171) is a wire that transmits the data voltage (DATA) generated by the data driver (not shown in FIG. 6). According to the data voltage (DATA), the light emitting current transmitted to the light emitting element (LED) changes and luminance of the light emitting element (LED) also changes.

The driving voltage line (172) applies the driving voltage (ELVDD).

The first initialization voltage line (127) transfers the first initialization voltage (Vinit), and the second initialization voltage line (128) transfers the second initialization voltage (AVinit).

The common voltage line (741) applies the common voltage (ELVSS) to the cathode of the light emitting element (LED).

In the present embodiment, voltages applied to the driving voltage line (172), the first and second initialization voltage lines (127, 128), and the common voltage line (741) may be constant voltages.

The driving transistor (T1) (also referred to as a first transistor) is a p-type transistor and has a silicon semiconductor as a semiconductor layer. The driving transistor (T1) controls the size of the light emitting current output to the anode of the light emitting element (LED) according to the level of the voltage of the gate electrode of the driving transistor (T1)—that is, the voltage stored in the storage capacitor (Cst). Since the brightness of the light emitting element (LED) changes according to the magnitude of the light emitting current output to the anode electrode of the light emitting element (LED), the light emitting luminance of the light emitting element (LED) can be adjusted according to the data voltage (DATA) applied to the pixel. For this purpose, the first electrode of the driving transistor (T1) is disposed to receive the driving voltage (ELVDD) and is connected to the driving voltage line (172) via the fifth transistor (T5). In addition, the first electrode of the driving transistor (T1) is connected to the second electrode of the second transistor (T2) to receive the data voltage (DATA). Meanwhile, the second electrode of the driving transistor (T1) outputs light emitting current to the light emitting element (LED) and is connected to the anode of the light emitting element (LED) via the sixth transistor (T6; hereinafter referred to as an output control transistor). The second electrode of the driving transistor (T1) is also connected to the third transistor (T3) to transfer the data voltage (DATA) applied to the first electrode to the third transistor (T3).

The gate electrode of the driving transistor (T1) is connected to one electrode (hereinafter referred to as a "second storage electrode") of the storage capacitor (Cst). The voltage of the gate electrode of the driving transistor (T1) thus changes according to the voltage stored in the storage capacitor (Cst), and the emission current output from the driving transistor (T1) correspondingly changes. The storage capacitor (Cst) may thus serve to keep the voltage of the gate electrode of the driving transistor (T1) constant for one frame.

The gate electrode of the drive transistor (T1) may also be connected with the third transistor (T3) so that the data voltage (DATA) applied to the first electrode of the drive transistor (T1) passes through the drive transistor (T1) and the third transistor (T3) to the gate electrode of the drive transistor (T1).

The gate electrode of the driving transistor (T1) may also be connected to the fourth transistor (T4) to be initialized by receiving the first initialization voltage (Vinit).

The second transistor (T2) is a p-type transistor and has a silicon semiconductor as a semiconductor layer. The second transistor (T2) is a transistor that receives the data voltage (DATA) into the pixel. The gate electrode of the second transistor (T2) is connected to the first scan line (151) and one electrode, hereinafter referred to as a "lower boost electrode," of the boost capacitor ($C_{boost}$)"). A first electrode of the second transistor (T2) is connected to the data line (171). The second electrode of the second transistor (T2) is connected to the first electrode of the driving transistor (T1). When the second transistor (T2) is turned on by the negative voltage of the first scan signal (GW) transmitted through the first scan line (151), the data voltage (DATA) transmitted through the data line (171) is transferred to the gate electrode of the driving transistor (T1) and stored in the storage capacitor (Cst).

The third transistor (T3) is an n-type transistor and has an oxide semiconductor as a semiconductor layer. The third transistor (T3) electrically connects the second electrode of the driving transistor (T1) and the gate electrode of the driving transistor (T1). As a result, the data voltage (DATA) is compensated by the threshold voltage of the driving transistor (T1) and then stored in the second storage electrode of the storage capacitor (Cst). The gate electrode of the third transistor (T3) is connected to the second scan line (152), and the first electrode of the third transistor (T3) is connected to the second electrode of the driving transistor (T1). The second electrode of the third transistor (T3) is connected to the second storage electrode of the storage capacitor (Cst), the gate electrode of the driving transistor (T1), and the other electrode, hereinafter referred to as "upper boost electrode," of the boost capacitor ($C_{boost}$). The third transistor (T3) is turned on by the voltage of the positive polarity of the second scan signals (GC) relative to the gate electrode and the second terminal of the driving transistor (T1). When the driving transistor (T1) and the third transistor (T3) are turned on, the voltage applied to the gate electrode of the driving transistor (T1) is transferred to the second storage electrode of the storage capacitor (Cst) and stored in the storage capacitor (Cst). At this time, the voltage stored in the storage capacitor (Cst) is the voltage of the gate electrode of the driving transistor (T1) when the driving transistor (T1) is turned off, so that the threshold voltage (Vth) of the driving transistor (T1) is stored in a compensated state.

The fourth transistor (T4) is an n-type transistor and has an oxide semiconductor as a semiconductor layer. The fourth transistor (T4) serves to initialize the gate electrode of the driving transistor (T1) and the second storage electrode of the storage capacitor (Cst). The gate electrode of the fourth transistor (T4) is connected to the initialization control line (153), and the first electrode of the fourth transistor (T4) is connected to the first initialization voltage line (127). The second electrode of the fourth transistor (T4) is connected to the second electrode of the third transistor (T3), the second storage electrode of the storage capacitor (Cst), the gate electrode of the driving transistor (T1), and the upper portion of the boost capacitor ($C_{boost}$). The fourth transistor (T4) is turned on by a voltage of positive polarity on the initialization control signals (GI) transmitted through the initialization control line (153). At this time, the first initialization voltage (Vinit) is applied to the gate of the driving transistor (T1), the second storage electrode of the storage capacitor (Cst), and the upper boost electrode of the boost capacitor ($C_{boost}$) to initialize them.

The fifth transistor (T5) and the sixth transistor (T6) are p-type transistors and have a silicon semiconductor as a semiconductor layer. The fifth transistor (T5) serves to transfer the driving voltage (ELVDD) to the driving transistor (T1). The gate electrode of the fifth transistor (T5) is connected to the emission control line (155), the first electrode of the fifth transistor (T5) is connected to the driving voltage line (172), and the second electrode is connected to the first electrode of the driving transistor (T1).

The sixth transistor (T6) serves to transfer the emission current output from the driving transistor (T1) to the light emitting element (LED). The gate electrode of the sixth transistor (T6) is connected to the emission control line (155), the first electrode of the sixth transistor (T6) is connected to the second electrode of the driving transistor (T1), and the second electrode of the sixth transistor (T6) is connected to the anode of the light emitting element (LED).

The seventh transistor (T7) is a p-type or n-type transistor and has a silicon semiconductor or an oxide semiconductor as a semiconductor layer. The seventh transistor (T7) serves to initialize the anode of the light emitting element (LED). The gate electrode of the seventh transistor (T7) is connected to the first scan line (151), the first electrode of the seventh transistor (T7) is connected to the anode of the light emitting element (LED), and the second electrode of the seventh transistor (T7) is connected to the second initialization voltage line (128). When the seventh transistor (T7) is turned on by a voltage of the negative polarity on the first scan line (151), the second initialization voltage (AVinit) is applied to the anode of the light emitting element (LED) to initialize it. Alternatively, the gate electrode of the seventh transistor (T7) may be connected to a separate bypass control line to be controlled by a separate wire from the first scan line (151). Also, depending on the embodiment, the second initialization voltage line (128) to which the second initialization voltage (AVinit) is applied may be the same as the first initialization voltage line (127) to which the first initialization voltage (Vinit) is applied.

An embodiment of the pixel (PX) is described as including, but not limited to, seven transistors (T1 to T7), two capacitors (a hold capacitor (Cst) and a boost capacitor ($C_{boost}$)), and in some embodiments, the boost capacitor ($C_{boost}$) may be excluded. Furthermore, while the third transistor and the fourth transistor in an embodiment are n-type transistors, it is possible that only one of them is formed as an n-type transistor or that the other transistor is formed as a p-type transistor. Also, in another embodiment, all of the seven transistors may be swapped to p-type transistors or n-type transistors.

Figure 7:
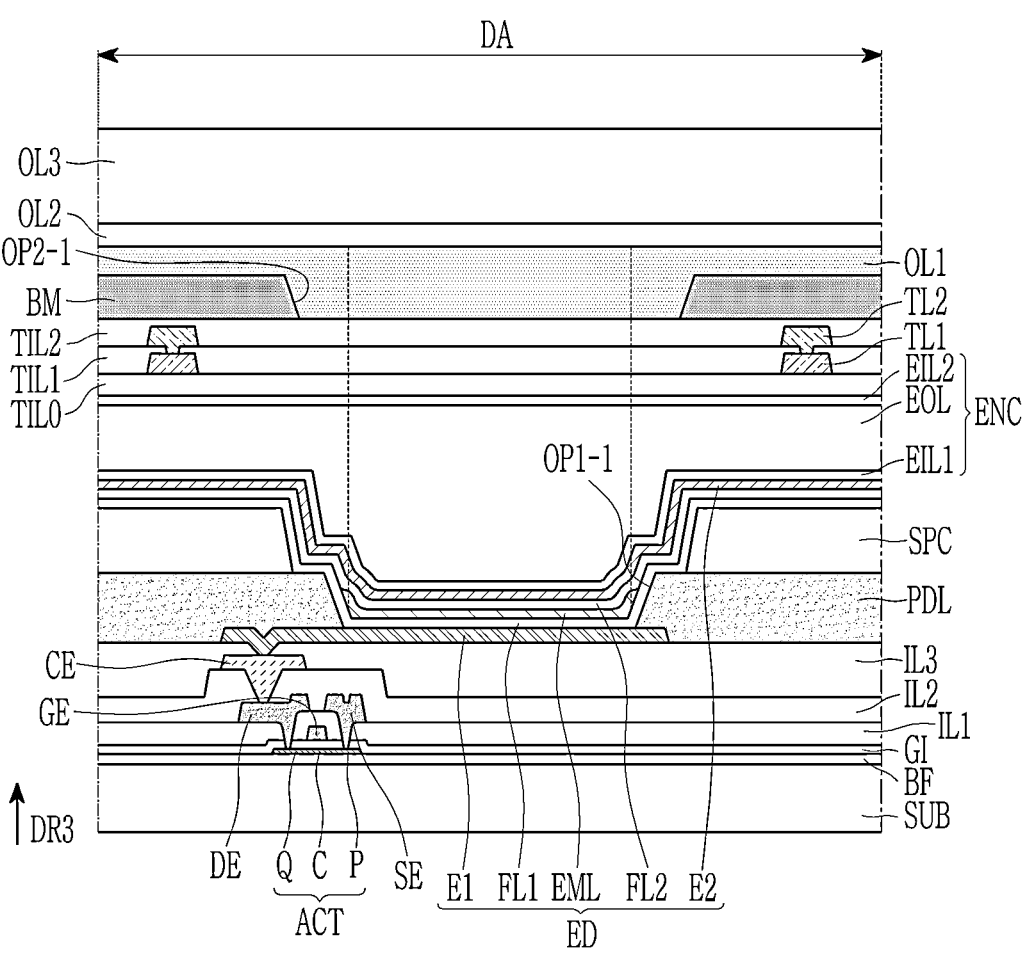
FIG. 7 is a cross-sectional view illustrating components in a display area according to an embodiment.

Hereinafter, structure of a display panel according to an embodiment will be described with reference to FIG. 7. FIG. 7 is a cross-sectional view showing components disposed in a display area according to an embodiment.

A display panel according to an embodiment shown in FIG. 7 includes a substrate (SUB). In an embodiment, the substrate (SUB) may include an inorganic insulating material such as glass or an organic insulating material comprising a plastic material such as polyimide (PI). The substrate (SUB) may have a single layer or multiple layers. In an embodiment, the substrate (SUB) may have a structure in which at least one base layer including a polymer resin and at least one inorganic layer are sequentially stacked alternately. The substrate (SUB) may have various degrees of flexibility. The substrate (SUB) may be a rigid substrate or a flexible substrate capable of being bent, folded, or rolled.

A buffer layer (BF) may be positioned on the substrate (SUB). The buffer layer (BF) blocks the transfer of impurities from the substrate (SUB) to the layers overlying the buffer layer (BF), particularly the semiconductor layer (ACT), thereby preventing deterioration of the characteristics of the semiconductor layer (ACT) and relieving stress. The buffer layer (BF) may include an organic insulating material or an inorganic insulating material such as silicon nitride or silicon oxide. Part or all of the buffer layer (BF) may be omitted in some embodiments.

A semiconductor layer (ACT) is positioned on the buffer layer (BF). The semiconductor layer (ACT) may include at least one of polycrystalline silicon and an oxide semiconductor. The semiconductor layer (ACT) includes a channel region (C), a first region (P), and a second region (Q). The first region (P) and the second region (Q) are respectively disposed on opposite sides of the channel region (C). The channel region (C) may be doped with a small amount of impurities or may include a semiconductor that is not doped with impurities. And the first region (P) and the second region (Q) comprise a semiconductor doped with a large amount of impurities compared to the channel region (C). The semiconductor layer (ACT) may be formed of an oxide semiconductor, and in this case, a separate protective layer (not shown) may be added to protect the oxide semiconductor material that is vulnerable to an external environment such as high temperature.

A gate insulating layer (GI) is positioned on the semiconductor layer (ACT). The gate insulating layer (GI) may be a single layer or a multi-layer including at least one of silicon oxide ($SiO_x$), silicon nitride ($SiN_x$), and silicon oxynitride ($SiO_xN_y$).

A gate electrode (GE) corresponding to the first conductive layer is positioned on the gate insulating layer (GI). The gate electrode (GE) may be a single layer or a multilayer structure in which a metal layer including any of copper (Cu), copper alloy, aluminum (Al), aluminum alloy, molybdenum (Mo), molybdenum alloy, titanium (Ti), and titanium alloy may be stacked. The gate electrode (GE) may overlap the channel region (C) of the semiconductor layer (ACT).

A first insulating layer (IL1) is positioned on the gate electrode (GE) and the gate insulating layer (GI). The first insulating layer (IL1) may be a single layer or a multilayer structure including at least one of silicon oxide ($SiO_x$), silicon nitride ($SiN_x$), and silicon oxynitride ($SiO_xN_y$).

A source electrode (SE) and a drain electrode (DE) corresponding to a second conductive layer are positioned on the first insulating layer (IL1). The source electrode (SE) and the drain electrode (DE) are respectively connected to the first region (P) and the second region (Q) of the semiconductor layer (ACT) through a contact hole formed in the first insulating layer (IL1). The source electrode (SE) and the drain electrode (DE) may contain aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and the like and may have a single layer or multi-layer structure including any of these.

A second insulating layer (IL2) is positioned on the first insulating layer (IL1), the source electrode (SE), and the drain electrode (DE). The second insulating layer (IL2) may be made of an organic material such as a general-purpose polymer such as polymethylmethacrylate (PMMA) or polystyrene (PS), a polymer derivative having a phenolic group, an acrylic polymer, an imide polymer, a polyimide, an acrylic polymer, or a siloxane polymer. Additional insulating material may be included. Although the present specification shows the second insulating layer (IL2) formed as a single layer, the second insulating layer (IL2) is not limited thereto and may be formed as multiple layers.

A connection electrode (CE) corresponding to the third conductive layer is positioned on the second insulating layer (IL2). The connection electrode (CE) may electrically connect the drain electrode (DE) and a first electrode (E1) of a light emitting element. The connection electrode (CE) may contain aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and the like, and may have a single layer or multilayer structure including the same.

A third insulating layer (IL3) is positioned on the connection electrode (CE). The third insulating layer (IL3) may contain an organic material such as a general-purpose polymer such as polymethylmethacrylate (PMMA) or polystyrene (PS), a polymer derivative having a phenolic group, an acryl-based polymer, an imide polymer, a polyimide, an acryl-based polymer, or a siloxane polymer. Additional insulating material may be included. Although FIG. 7 shows the third insulating layer (IL3) formed as a single layer, the third insulating layer (IL3) is not limited thereto and may be formed as multiple layers.

The first electrode (E1) is positioned on the third insulating layer (IL3). The first electrode (E1) is electrically connected to the connection electrode (CE) through a contact hole in the third insulating layer (IL3). The first electrode (E1) may include a metal such as silver (Ag), lithium (Li), calcium (Ca), aluminum (Al), magnesium (Mg), or gold (Au) or may include indium tin oxide (ITO) or another transparent conductive oxide (TCO) such as indium zinc oxide (IZO). The first electrode (E1) may be formed of a single layer including a metal material or a transparent conductive oxide or multiple layers including the same. For example, the first electrode (E1) may have a triple-layer structure of indium tin oxide (ITO)/silver (Ag)/indium tin oxide (ITO).

The transistor including the gate electrode (GE), the semiconductor layer (ACT), the source electrode (SE), and the drain electrode (DE) is connected to the first electrode (E1) to supply current to the light emitting element.

A pixel definition layer (PDL) is positioned on the third insulating layer (IL3) and the first electrode (E1). The pixel definition layer (PDL) has a 1-1 opening (OP1-1) overlapping at least a portion of the first electrode (E1) and defining an emission region. The 1-1 opening (OP1-1) may have a substantially similar planar shape to that of the first electrode (E1). The 1-1 opening (OP1-1) may have a circular shape on a plane but is not limited thereto and may have any shape such as a rhombus or an octagon similar to a rhombus, a quadrangle, a polygon, an ellipse, or the like. The pixel definition layer (PDL) may include an organic insulating material. Alternatively, the pixel definition layer (PDL) may include an inorganic insulator such as silicon oxide ($SiO_x$), silicon nitride ($SiN_x$), and silicon oxynitride ($SiO_xN_y$). Alternatively, the pixel definition layer (PDL) may include an organic insulator and an inorganic insulator.

In an embodiment, the pixel definition layer (PDL) includes a light blocking material and may be provided in black. The light blocking material may include carbon black, carbon nanotubes, a resin or paste comprising a black dye, metal particles such as nickel, aluminum, molybdenum, and alloys thereof, metal oxide particles (e.g., chromium oxide), or metal nitride particles (e.g., chromium nitride). When the pixel definition layer (PDL) includes a light blocking material, reflection of external light by metal structures disposed under the pixel definition layer (PDL) may be reduced. However, the embodiment is not limited thereto. In another embodiment, the pixel definition layer (PDL) may include a light-transmitting organic insulating material without including a light blocking material.

A spacer (SPC) may be disposed on the pixel definition layer (PDL). The spacer (SPC) may include an organic insulating material such as polyimide. Alternatively, the spacer (SPC) may include an inorganic insulator such as silicon oxide ($SiO_x$), silicon nitride ($SiN_x$), or silicon oxynitride ($SiO_xN_y$) or may include an organic insulator and an inorganic insulator. In an embodiment, the spacer (SPC) may include the same material as the pixel definition layer (PDL). In this case, the pixel definition layer (PDL) and the spacer (SPC) may be formed together in a mask process using a half-tone mask or the like. In an embodiment, the pixel definition layer (PDL) and the spacer (SPC) may include different materials.

An emission layer (EML) is positioned on the first electrode (E1). The emission layer (EML) may include an organic material and/or an inorganic material. The emission layer (EML) may generate light of a predetermined color. The emission layer (EML) may be formed to be positioned only within the 1-1 opening (OP1-1) of the pixel defining layer using a mask or an inkjet process.

The first functional layer (FL1) may be positioned between the emission layer (EML) and the first electrode (E1), and the second functional layer (FL2) may be positioned between the emission layer (EML) and the second electrode (E2). The first functional layer (FL1) may include at least one of a hole injection layer (HIL) and a hole transporting layer (HTL), and the second functional layer (FL2) may include at least one of an electron transporting layer (ETL) and an electron injection layer (EIL). While the emission layer (EML) is disposed for each pixel to correspond to the opening (OP1-1) of the pixel definition layer (PDL), each of the first functional layer (FL1) and the second functional layer (FL2) may cover the substrate (SUB) and may be continuously formed to cover the whole surface of the substrate (SUB). In other words, the first functional layer (FL1) and the second functional layer (FL2) may be integrally formed to entirely cover the display area (DA) of the substrate (SUB).

A second electrode (E2) is positioned on the emission layer (EML). The second electrode (E2) may include calcium (Ca), barium (Ba), magnesium (Mg), aluminum (Al), silver (Ag), gold (Au), nickel (Ni), chromium (Cr), and lithium (Li), a reflective metal including calcium (Ca) and molybdenum (Mo), or a transparent conductive oxide (TCO) such as indium tin oxide (ITO) and indium zinc oxide (IZO).

The first electrode (E1), the emission layer (EML), and the second electrode (E2) may constitute the light emitting element (LED). Here, the first electrode (E1) may be an anode that is a hole injection electrode, and the second electrode (E2) may be a cathode that is an electron injection electrode. However, the embodiment is not necessarily limited thereto, and the first electrode (E1) may serve as a cathode and the second electrode (E2) may serve as an anode according to a driving method of the display device. In any case, holes and electrons are injected into the emission layer (EML) from the first electrode (E1) and the second electrode (E2), and light emission results when an electron falls from an excited state to a lower-energy state corresponding to an injected hole.

An encapsulation layer (ENC) is positioned on the second electrode (E2). The encapsulation layer (ENC) may cover and seal not only the top surface of the light emitting element (LED) but also the side surface. Since the light emitting element (LED) may be very vulnerable to moisture and oxygen, the encapsulation layer (ENC) seals the light emitting element (LED) to block the inflow of external moisture and oxygen. The encapsulation layer (ENC) may include a plurality of layers and may be a multilayer structure including both an inorganic layer and an organic layer—for example, a first encapsulation inorganic layer (EIL1) and an encapsulation organic layer (EOL). A second encapsulation inorganic layer (EIL2) may be formed in a triple layer structure in which the encapsulation layer includes the first encapsulation inorganic layer (EIL1), the encapsulation organic layer (EOL), and the second encapsulation inorganic layer (EIL2), which are sequentially formed.

The first encapsulation inorganic layer (EIL1) may cover the second electrode (E2). The first encapsulating inorganic layer (EIL1) may prevent penetration of external moisture or oxygen into the light emitting element (LED). For example, the first encapsulation inorganic layer (EIL1) may include silicon oxide ($SiO_x$), silicon nitride ($SiN_x$), silicon oxynitride ($SiO_xN_y$), or a combination thereof. The first encapsulation inorganic layer (EIL1) may be formed through a deposition process.

The encapsulation organic layer (EOL) may be disposed on the first encapsulation inorganic layer (EIL1) and may contact the first encapsulation inorganic layer (EIL1). The irregularities formed on the top surface of the first encapsulation inorganic layer (EIL1), or the particles positioned on the first encapsulation inorganic layer (EIL1) may be covered by the encapsulation organic layer (EOL). The encapsulation organic layer (EOL) may block the effect of the surface state of the upper surface of the first encapsulation inorganic layer (EIL1). Also, the encapsulation organic layer (EOL) may relieve stress between contacting layers. The encapsulation organic layer (EOL) may include an organic material and may be formed through a solution process such as spin coating, slit coating, or an inkjet process.

The second encapsulation inorganic layer (EIL2) is disposed on the encapsulation organic layer (EOL) and covers the encapsulation organic layer (EOL). The second encapsulation inorganic layer (EIL2) may be stably formed on a relatively flat surface of the encapsulation organic layer (EOL). The second encapsulation inorganic layer (EIL2) encapsulates moisture emitted from the encapsulation organic layer (EOL) and prevents leakage to the outside. The second encapsulation inorganic layer (EIL2) may include silicon oxide ($SiO_x$), silicon nitride ($SiN_x$), silicon oxynitride ($SiO_xN_y$), or a combination thereof. The second encapsulation inorganic layer (EIL2) may be formed through a deposition process.

A first insulating layer (TIL0), a first conductive layer (TL1), a first touch insulating layer (TIL1), a second conductive layer (TL2), and a second touch insulating layer (TIL2) may be positioned on the encapsulation layer (ENC). The first insulating layer (TIL0), the first conductive layer (TL1), the first touch insulating layer (TIL1), the second conductive layer (TL2), and the second touch insulating layer (TIL2) may form a touch sensor (TS) such as described above with reference to FIG. 3.

The first insulating layer (TIL0) may be disposed on the second encapsulation inorganic layer (EIL2) of the encapsulation layer (ENC) to planarize a surface on which the first conductive layer (TL1) is disposed. In this case, the first conductive layer (TL1) may be directly disposed on the first insulating layer (TIL0). The first insulating layer (TIL0) may include an inorganic insulating material such as silicon oxide ($SiO_x$), silicon nitride ($SiN_x$), or silicon oxynitride ($SiO_xN_y$). Alternatively, the first insulating layer (TIL0) may include an organic insulating material.

Alternatively, according to the embodiments, the conductive layer (TL1) may be directly disposed on the encapsulation layer (ENC). According to some embodiments, the first insulating layer (TIL0) may be omitted. In this case, the first conductive layer (TL1) may be directly disposed on the second encapsulation inorganic layer (EIL2) of the encapsulation layer (ENC). However, the embodiment is not limited thereto.

In an embodiment, a first touch insulating layer (TIL1) may be disposed on the first conductive layer (TL1). The first touch insulating layer (TIL1) may be made of an inorganic or organic material. When the first touch insulating layer (TIL1) is made of an inorganic material, the first touch insulating layer (TIL1) may include silicon nitride, aluminum nitride, zirconium nitride, titanium nitride, hafnium nitride, tantalum nitride, silicon oxide, aluminum oxide, and titanium oxide, and at least one material selected from the group consisting of tin oxide, cerium oxide, and silicon oxynitride. When the first touch insulating layer (TIL1) is made of an organic material, the first touch insulating layer (TIL1) may include acrylic resin, methacrylic resin, polyisoprene, vinyl resin, epoxy resin, urethane resin, cellulose resin, and the like. It may include at least one material selected from the group containing a perylene-based resin.

In an embodiment, the second conductive layer (TL2) may be disposed on the first touch insulating layer (TIL1). The second conductive layer (TL2) can act as a sensor to detect touch input from a user. The first conductive layer (TL1) may serve as a connecting portion connecting the patterned second conductive layer (TL2) in one direction.

In an embodiment, both the first conductive layer (TL1) and the second conductive layer (TL2) may serve as sensors. In this case, the first conductive layer (TL1) and the second conductive layer (TL2) may be electrically connected through a contact hole. In this way, both the first conductive layer (TL1) and the second conductive layer (TL2) serve as sensors, and the resistance of the touch electrode is reduced, so that a user's touch input can be quickly sensed.

In an embodiment, the first conductive layer (TL1) and the second conductive layer (TL2) may have, for example, a mesh structure to allow light emitted from the light emitting element (LED) to pass therethrough. In this case, the first conductive layer (TL1) and the second conductive layer (TL2) may be disposed not to overlap the emission layer (EML). The first conductive layer (TL1) and the second conductive layer (TL2) may include a metal layer or a transparent conductive layer. The metal layer may include molybdenum (Mo), silver (Ag), titanium (Ti), copper (Cu), aluminum (Al), and alloys thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as PEDOT, metal nanowires, carbon nanotubes, or graphene.

In an embodiment, a second touch insulating layer (TIL2) may be disposed on the second conductive layer (TL2). The second touch insulating layer (TIL2) may include an inorganic or organic material. When the second touch insulating layer (TIL2) includes an inorganic material, the second touch insulating layer (TIL2) may include silicon nitride, aluminum nitride, zirconium nitride, titanium nitride, hafnium nitride, tantalum nitride, silicon oxide, aluminum oxide, and titanium oxide, and at least one material selected from the group consisting of tin oxide, cerium oxide, and silicon oxynitride. When the second touch insulating layer (TIL2) includes an organic material, the second touch insulating layer (TIL2) may include acryl-based resin, methacrylic resin, polyisoprene, vinyl resin, epoxy resin, urethane-based resin, cellulose resin, and the like, and it may include at least one material selected from the group containing a perylene-based resin.

A light blocking layer (BM) may be positioned on the second touch insulating layer (TIL2). The light blocking layer (BM) may include the 2-1 opening (OP2-1) overlapping the emission layer (EML). The light blocking layer (BM) may overlap at least a portion of the pixel definition layer (PDL).

A reflection control layer (OL1) may be disposed on the light blocking layer (BM). The reflection control layer (OL1) may selectively absorb light having a wavelength of a partial band among light reflected from inside the display device or light incident from the outside of the display device.

A second capping layer (OL2) may be positioned on the reflection control layer (OL1). The second capping layer (OL2) according to an embodiment may overlap the front surface of the substrate (SUB).

An overcoat layer (OL3) may be positioned on the second capping layer (OL2). The overcoat layer (OL3) may be made of an organic material or an inorganic material. The overcoat layer (OL3) may completely cover the second capping layer (OL2) while overlapping the entire surface of the substrate (SUB). The overcoat layer (OL3) may protect the reflection control layer (OL1) and the like positioned under the overcoat layer (OL3). An upper surface of the overcoat layer (OL3) may be formed flat.

Figure 8:
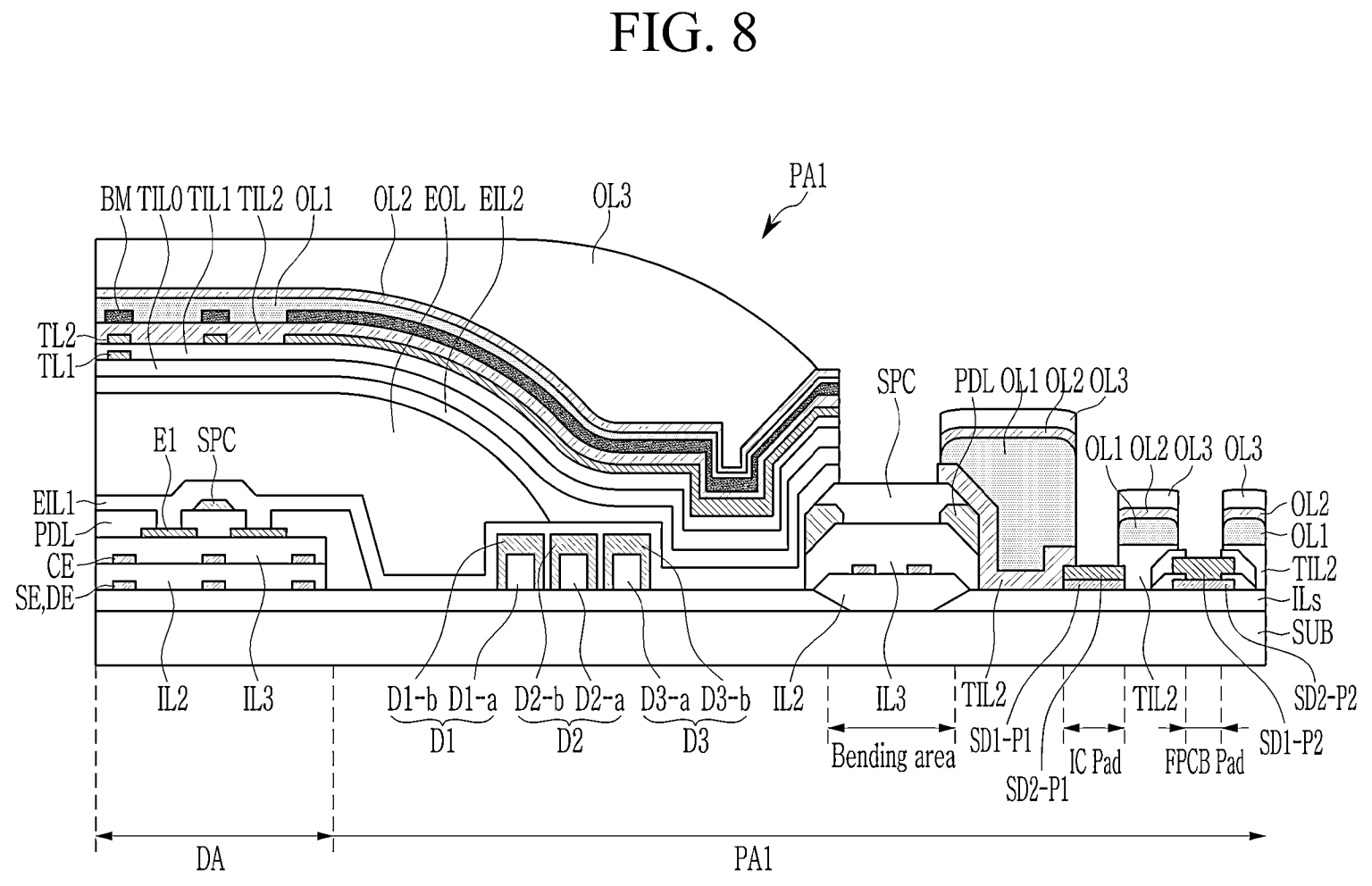

The display area (DA) and the first non-display area (PA1) adjacent to the display area (DA) is described here with reference to FIG. 8. FIG. 8 is a cross-sectional view schematically illustrating the display area (DA) and the first non-display area (PA1) adjacent to the display area (DA). FIG. 8 shows a somewhat simplified stack structure for the display area (DA), and reference is made to FIG. 7 for a detailed structure.

A plurality of dams (D1, D2, D3) may be positioned in the first non-display area (PA1). Although FIG. 8 shows three dams, the embodiment is not limited to the numbers and types of dams illustrated. The plurality of dams (D1, D2, D3) are formed on a stack structure (ILs) extending from the display area (DA). The first dam (D1) may include a sub dam (D1-*a*) and a sub dam (D1-*b*). The second dam (D2) may include a sub dam (D2-*a*) and a sub dam (D2-*b*). The third dam (D3) may include a sub dam (D3-*a*) and a sub dam (D3-*b*). The first dam (D1), the second dam (D2), and the third dam (D3) may include the same material as organic layers in the display area (DA) and may be formed by the same process that forms the organic layers in the display area (DA). Some layers in the display area (DA) end at the dams (D1, D2, D3) but other layers may extend onto of beyond the dams (D1, D2, D3). For example, the first encapsulation inorganic layer (EIL1) extends from the display area (DA) onto each of the dams (D1, D2, D3).

The first dam (D1) positioned closest to the display area (DA) may overlap the encapsulation organic layer (EOL) extending from the display area (DA). In the process of forming the encapsulation organic layer (EOL), the organic material for forming the encapsulation organic layer (EOL) may be prevented from overflowing by the first dam (D1).

The second encapsulation inorganic layer (EIL2) may be positioned on the encapsulation organic layer (EOL) in the display area (DA). The second encapsulation inorganic layer (EIL2) may contact the first encapsulation inorganic layer (EIL1) on at least a part of the second dam (D2) and the third dam (D3). The structure in which the first encapsulation inorganic layer (EIL1) contacts the second encapsulation inorganic layer (EIL2) may block moisture and oxygen from the outside from reaching the encapsulation organic layer (EOL).

A first insulating layer (TIL0), a first touch insulating layer (TIL1), a second touch insulating layer (TIL2), a light blocking member (BM), a second capping layer (OL2), and an overcoat layer (OL3) extending from the display area (DA) onto the dams (D1, D2, D3) may be on the second encapsulation inorganic layer (EIL2). In addition, a signal line extending from the second conductive layer (TL2) may be included in the structure.

An IC pad unit (IC pad) to which the data driver (50) is coupled is in the first non-display area (PA1) and has a double layer structure. The pad unit (IC pad) as illustrated includes data addition pad electrodes (SD1-P1) and data pad addition electrodes (SD2-P1). The data addition pad electrodes (SD1-P1) may be formed in the same process that forms the source electrode (SE) in the display area (DA), and the data addition pad electrodes (SD2-P1) may be formed in the same process the forms the connection electrode (CE) in the display area (DA). Depending on the embodiment, the IC pad unit (IC pad) for the data driver may further include a gate additional pad electrode formed in the same process as the gate electrode in addition to the above-described additional pad electrodes. The aforementioned data driver (50) may be coupled to the pad unit (IC pad) for the data driver.

A pad unit for the circuit board (FPCB pad) is shown in FIG. 8 as a double-layer structure. The pad unit for the circuit board (FPCB pad) includes additional pad electrodes (SD1-P2) that may be formed in the same process that forms the source electrode SE and includes additional pad electrodes (SD1-P2) that may be formed in the same process that forms the connection electrode (CE). The flexible printed circuit board (FPCB) described above may be coupled to the circuit board pad (FPCB pad).

A bending area may be positioned between the third dam (D3) and the IC pad unit (IC pad) for the data driver. Inorganic layers may be removed in a bending area, so that the inorganic layers are not included in the bending area. An insulating layer formed through the same process that forms the second insulating layer (IL2), the third insulating layer (IL3), the pixel definition layer (PDL), and the spacer (SPC) may be in the bending area. In the bending area, an insulating layer made of an organic material may be positioned at the outermost part.

External moisture may flow into the bending area, and the inflowed moisture may move toward the data driver (50) or the pad unit along an insulating layer made of an organic material.

FIG. 9 to FIG. 12 show cross-sectional views of the display panel in a region (R1) that is between the bending area and the data driver as shown in the plan view of FIG. 4. Descriptions of components identical to those described above will be omitted below.

Figure 9:
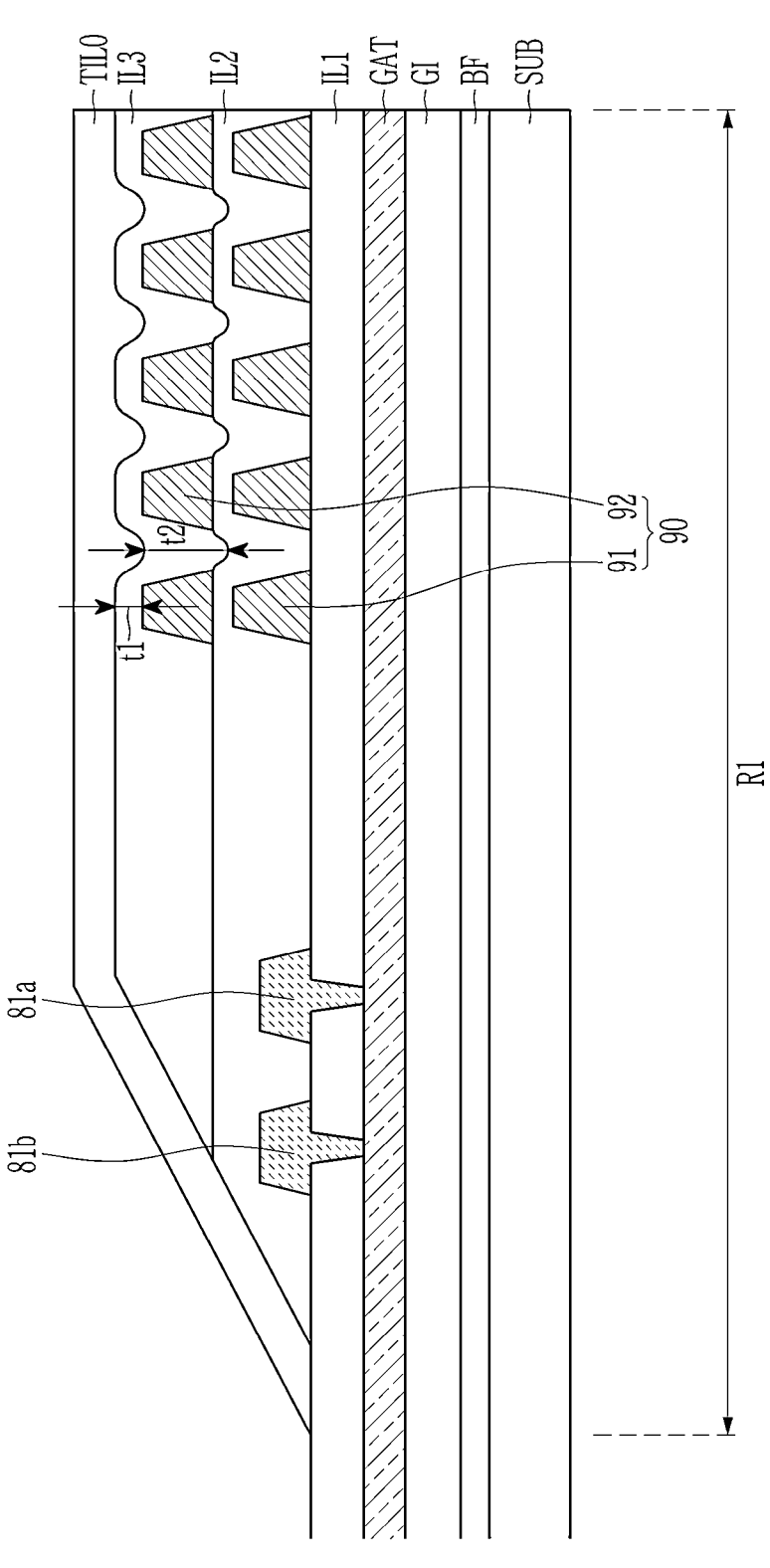
FIG. 9 is a cross-sectional view illustrating a portion of a non-display area according to an embodiment.

FIG. 9 shows an embodiment in which the region (R1) includes a buffer layer (BF), a gate insulating layer (GI), an electrostatic discharge circuit connecting wire (GAT), a first insulating layer (IL1), a second insulating layer (IL2), a third insulating layer (IL3), and an inorganic insulating layer (TIL0) extending from the display area (DA).

A dummy pattern unit (90) including one or more dummy patterns (91, 92) may be positioned in the region R1. The dummy pattern unit (90) include a first dummy pattern (91) positioned between the first insulating layer (IL1) and the second insulating layer (IL2) and the second dummy pattern (92) positioned between the second insulating layer (IL2) and the third insulating layer (IL3).

The first dummy pattern (91) may be positioned on the same layer as the second conductive layer, which includes the source electrode and drain electrode described above. The first dummy pattern (91) includes the same material as the second conductive layer and may be formed in the same process that forms the second conductive layer.

The second dummy pattern (92) may be positioned on the same layer as the third conductive layer, which includes the connection electrode described above. The second dummy pattern (92) may include the same material as the third conductive layer and may be formed in the same process that forms the third conduction layer.

The first dummy pattern (91) and the second dummy pattern (92) may overlap each other. More particularly, as shown in FIG. 9 as well as FIG. 5, edges of the first dummy pattern (91) and the second dummy pattern (92) may be aligned while overlapping each other. The second insulating layer (IL2) may fill spaces or gaps between adjacent sections of the first dummy pattern (91). The third insulating layer (IL3) may fill gaps between adjacent sections of the second dummy pattern (92). In an embodiment in which the second insulating layer (IL2) and the third insulating layer (IL3) include the same material, it may be difficult to distinguish a boundary between the second insulating layer (IL2) and the third insulating layer (IL3).

In an embodiment, the second insulating layer (IL2) may be recessed between the sections of the first dummy pattern (91), and the third insulating layer (IL3) may fill the recesses in the second insulating layer (IL2). The third insulating layer (IL3) may similarly be concaved or recessed between sections of the second dummy pattern (92). As a result, an upper surface of the third insulating layer (IL3) may have a shape with protrusions and depressions over the dummy pattern unit (90). The second insulating layer (IL2) and the third insulating layer (IL3) may include a thick portion and a thin portion due to the first and second dummy patterns (91) and (92). The third insulating layer (IL3) may particularly include a first portion having a first thickness (t1) and a second portion having a second thickness (t2). The first thickness (t1) may be smaller than the second thickness (t2). The first portion may overlap the dummy pattern unit (90) and the second portion may be spaced apart from or between sections of the dummy pattern unit (90). Where the second insulating layer (IL2) and the third insulating layer (IL3) are thin, the area through which moisture can pass inside the third insulating layer (IL3) is small, so that the movement of moisture introduced from the bending area can be reduced.

Also, if the moisture coming into the bending area moves along the second insulating layer (IL2) or the third insulating layer (IL3), the first dummy pattern (91) and the second dummy pattern (92) can increase the length of the path of moisture movement. As the lengths of the paths that moisture follows are increased by the first dummy pattern (91) and the second dummy pattern (92), the first dummy pattern (91) and the second dummy pattern (92) may reduce the inflow of moisture or prevent moisture from reaching the data driver or the pad unit.

An inorganic insulating layer (TIL0) may be positioned on the third insulating layer (IL3). The inorganic insulating layer (TIL0) may cover even the third insulating layer (IL3) and the first inspection circuit units (81a, 81b) positioned in the region (R1).

Figure 10:
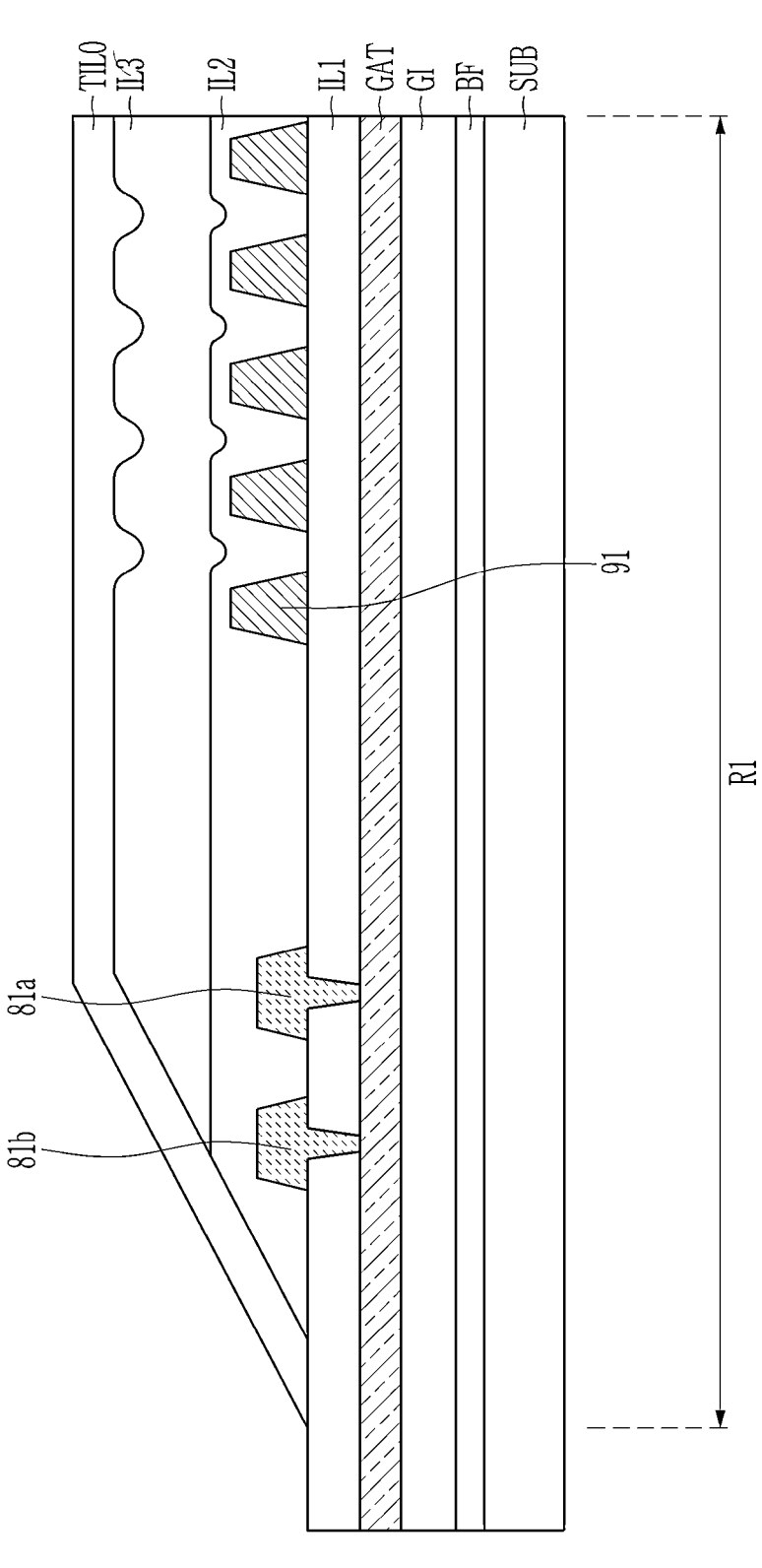
FIG. 10, FIG. 11, and FIG. 12 are cross-sectional views illustrating a portion of a non-display area according to alternative embodiments.

The region (R1) according to an embodiment illustrated in FIG. 10 includes a buffer layer (BF), a gate insulating layer (GI), and an electrostatic discharge circuit connection line (GAT) extending from the display area (DA) and through the region (R1). An insulating layer (IL1), a second insulating layer (IL2), a third insulating layer (IL3), and an inorganic insulating layer (TIL0) may end near an end of the region (R1).

A first dummy pattern (91) including a plurality of sections may be in the region (R1). The first dummy pattern (91) may be between the first insulating layer (IL1) and the second insulating layer (IL2). The first dummy pattern (91) may be part of the second conductive layer, which also includes the source electrode and the drain electrode described above. The first dummy pattern (91) may include the same material as the second conductive layer (TL2) and may be formed in the same process that forms the second conductive layer (TL2).

A second insulating layer (IL2) and a third insulating layer (IL3) may be positioned on the first dummy pattern (91). The second insulating layer (IL2) may have a contour including recesses between sections of the first dummy pattern (91). Upper surfaces of the second insulating layer (IL2) and the third insulating layer (IL3) may have the shapes of protrusions and depressions.

Moisture introduced from the bending area may move toward the data driver (50) or the pad unit (PAD) through the second insulating layer (IL2) or the third insulating layer (IL3). In this case, the path along which the moisture moves may be increased according to the contour or shape of the second insulating layer (IL2) or the third insulating layer (IL3), which includes repeated undulations caused by sections of the first dummy pattern (91), and thus the moisture may thus take a longer time to reach the driving unit (50) or the pad unit (PAD).

Figure 11:
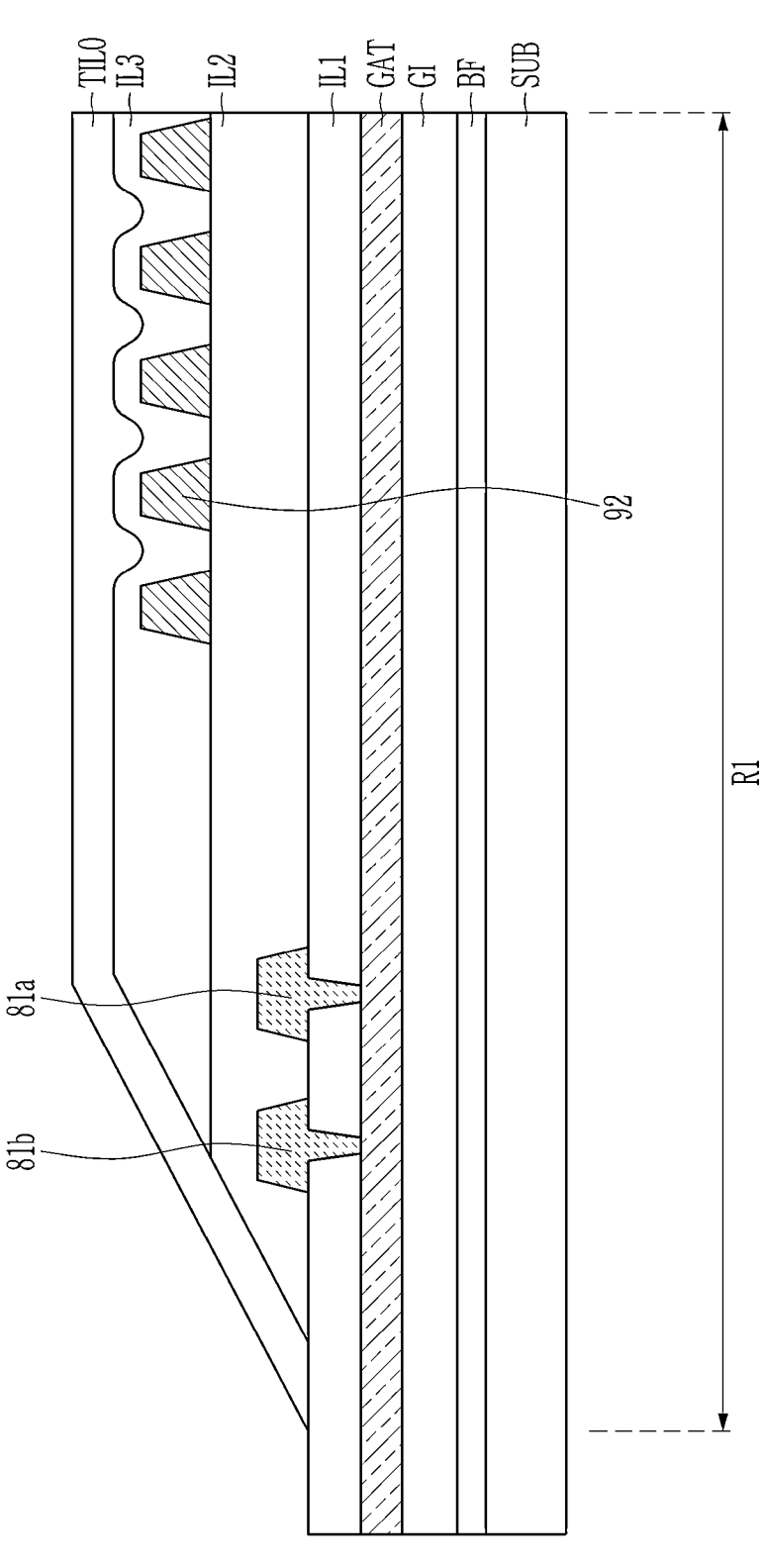

FIG. 11 shows an embodiment of the region (R1) that includes a buffer layer (BF) extending from the display area (DA), a gate insulating layer (GI), and a static electricity discharge circuit connection line (GAT). first insulating layer (IL1), a second insulating layer (IL2), a third insulating layer (IL3), and an inorganic insulating layer (TIL0) may be included in the region (R1).

A second dummy pattern (92) including a plurality of sections may be positioned in the region (R1). The second dummy pattern (92) may be between the second insulating layer (IL2) and the third insulating layer (IL3). The second dummy pattern (92) may be on the same layer as the aforementioned third conductive layer (connection electrode). The second dummy pattern (92) may include the same material as the third conductive layer and may be formed in the same process that forms the third conductive layer.

The third insulating layer (IL3) may be on the second dummy pattern (92). An upper surface of the third insulating layer (IL3) may have a shape or contour including protrusions and depressions while filling the spaces around the second dummy pattern (92). In particular, the third insulating layer (IL3) may have a recessed shape between adjacent sections of the second dummy pattern (92).

Moisture entering the display panel from the bending area may move toward the data driver (50) or the pad unit (PAD) through the second insulating layer (IL2) or the third insulating layer (IL3). In this case, a path through which moisture travels may be increased by the multiple sections of the second dummy pattern (92) that are repeatedly disposed along the travel path, and thus the time for the moisture from the bending area to reach the data driver (50) or the pad unit (PAD) may be delayed.

Figure 12:
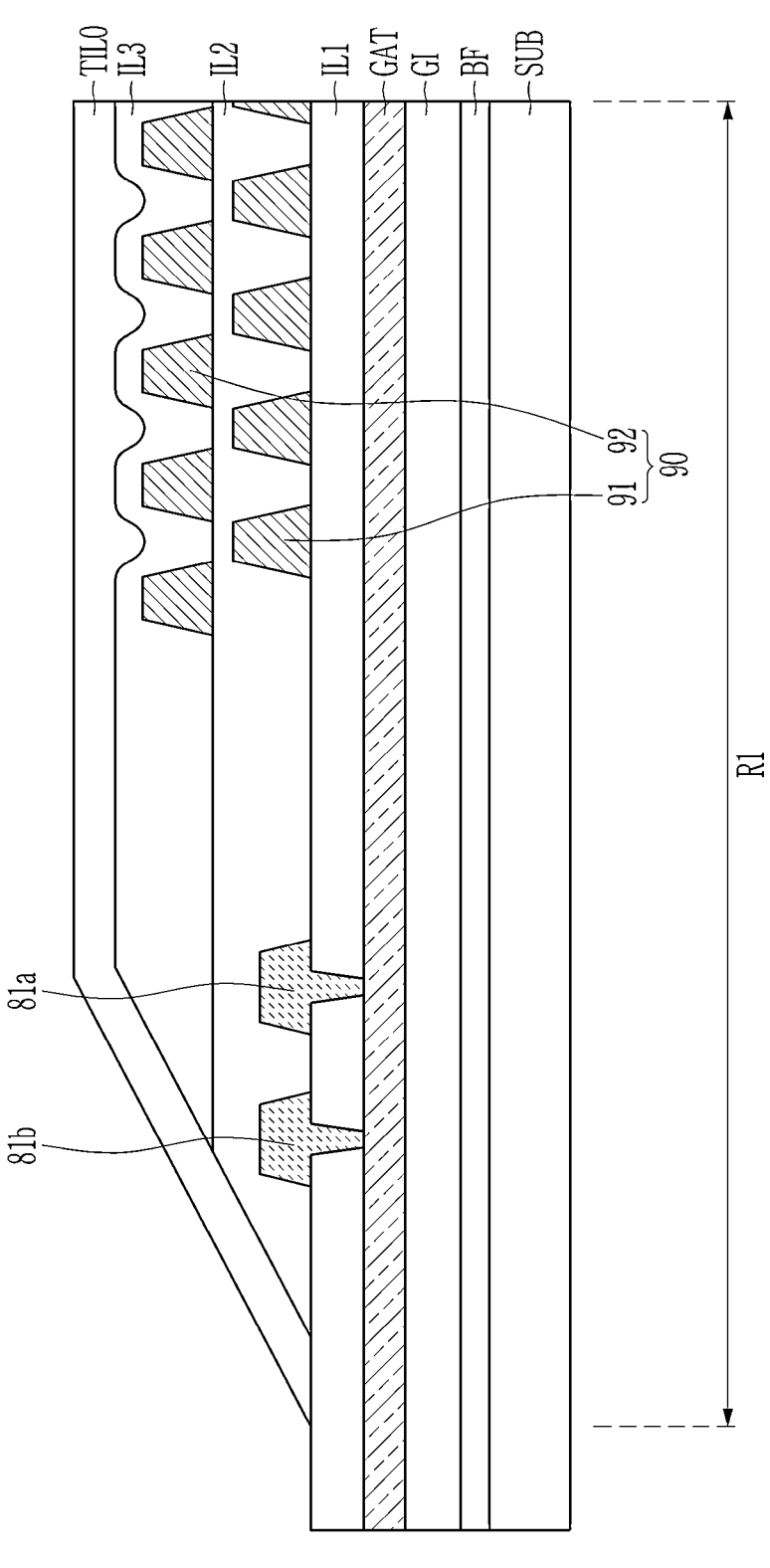

FIG. 12 shows an embodiment of the region (R1) that includes a buffer layer (BF), a gate insulating layer (GI), and a static electricity discharge circuit connection line (GAT), extending from the display area (DA) and through the region (R1). An insulating layer (IL1), a second insulating layer (IL2), a third insulating layer (IL3), and an inorganic insulating layer (TIL0) may be included in the region (R1).

A first dummy pattern (91) and a second dummy pattern (92), each including a plurality of sections, may be positioned in the region (R1). The first dummy pattern (91) may be between the first insulating layer (IL1) and the second insulating layer (IL2). The second dummy pattern (92) may be between the second insulating layer (IL2) and the third insulating layer (IL3). Unlike the embodiment of FIG. 9, sections of the first dummy pattern (91) and sections of the second dummy pattern (92) may be alternately arranged in cross-section view as shown in FIG. 12.

Moisture inflowed from the bending area may move toward the driver (50) or the pad unit (PAD) through the second insulating layer (IL2) or the third insulating layer (IL3). In this embodiment, the repeated placement of multiple first dummy patterns (91) and second dummy patterns (92) increases the length of the path of moisture movement, and thus, the time required for the moisture to reach the driver (50) or pad unit (PAD) can be increased.

Figure 14:
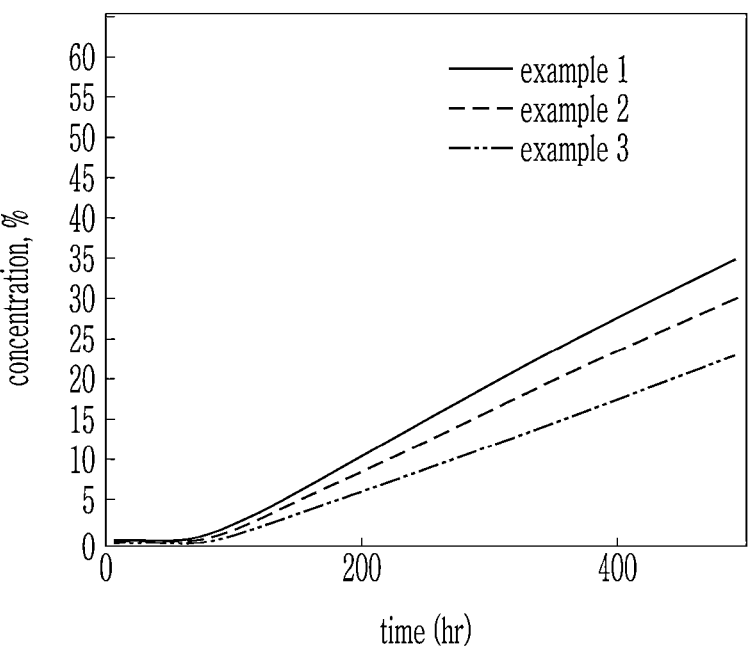
Figure 15:
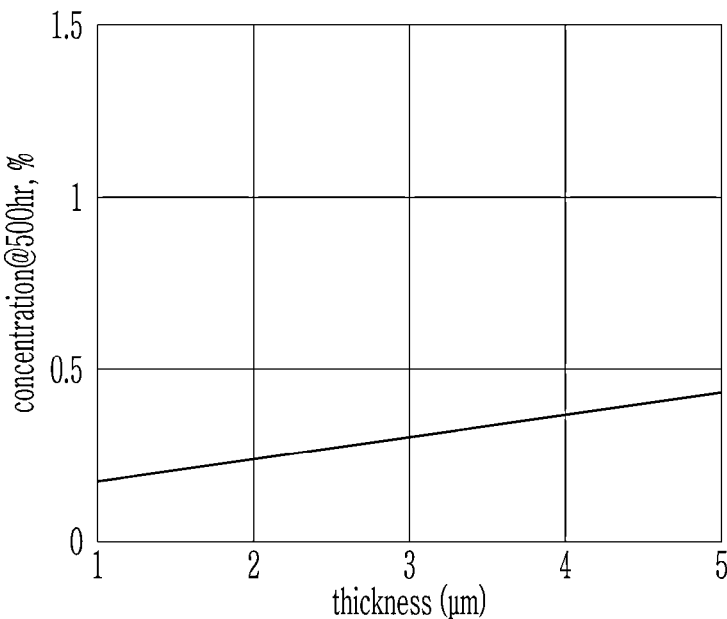
Figure 16:
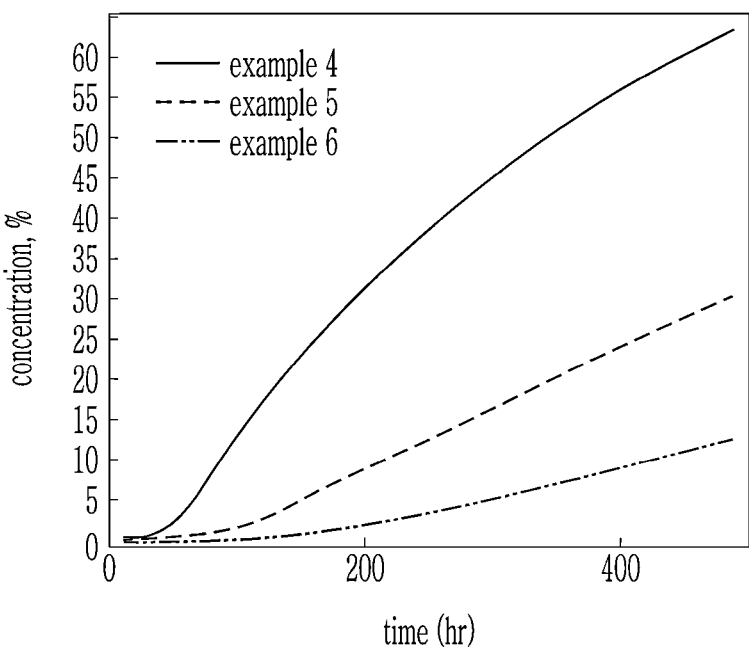
Figure 17:
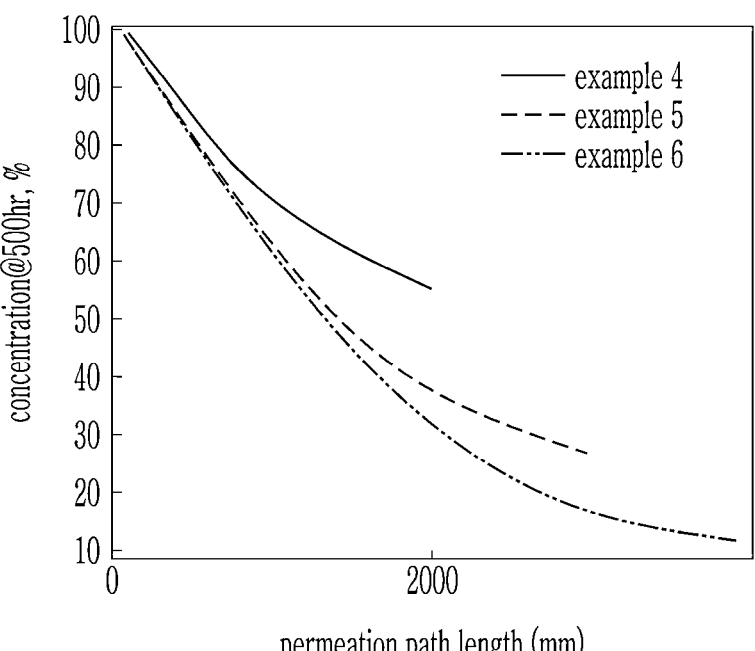

FIG. 13 to FIG. 17 illustrate experimental results for embodiments. FIG. 13 shows oxidation of an inorganic layer positioned near a bending area and a data driver after exposure to moisture for three different times, and FIG. 14 is a graph examining moisture concentration over time for each thickness of an insulating layer. FIG. 15 is a graph of moisture concentration according to the thickness of the insulating layer after 500 hours have elapsed. FIG. 16 is a graph of moisture concentration according to the distance between a bending area and an inspection circuit unit. FIG. 17 is a graph showing dependence of moisture concentration on the distance between the bending area and the inspection circuit unit after 500 hours have elapsed.

First, referring to FIG. 13, it was confirmed that moisture was inflowed through the organic insulating layer exposed in the bending region, and the moisture was gradually absorbed starting from the bending region. In particular, it was confirmed that the degree of oxidation of the inorganic layer in the vicinity of the bending area was higher than that of the inorganic layer in the area adjacent to the data driver. The results shown in FIG. 13 also confirmed that a relatively high level of oxidation occurred in the inorganic layer positioned near the bending area into which moisture was inflowed due to a relatively large amount of moisture. That is, it was confirmed that the inorganic layer positioned in the non-display area was oxidized by moisture inflowed through the bending area.

FIG. 14 shows how the moisture concentration in the inspection circuit unit increased with time regardless of the thickness of the insulating layer. Moisture introduced from the bending area moves to the inspection circuit unit over time, and the moisture concentration in the inspection circuit unit increases. In FIG. 14, an example 1 is a case where the thickness of the organic insulating layer is 4.2 micrometers, an example 2 is a case where the thickness of the organic insulating layer is 3.2 micrometers, and an example 3 is a case where the thickness of the organic insulating layer is 2.2 micrometers. It can be seen that the moisture concentration in the test circuit unit is higher in the example 1, which has the thickest organic insulating layer, than in the example 3, which has the thinnest organic insulating layer. That is, as the thickness of the insulating layer increases, the area through which moisture can move increases, thereby increasing the rate at which the moisture concentration increases.

FIG. 15 as well, shows how as the thickness of the insulating layer increases, the moisture concentration increases after 500 hours increases. According to an embodiment of the present disclosure, a dummy pattern can decrease the thickness of a part of the organic insulating layer, and the experimental results shown in FIG. 15 confirms that the movement of moisture through the organic insulating layer can be reduced by blocking or reducing the passage of moisture.

In FIG. 16 and FIG. 17, an example 4 is a case where the distance from the bending area to the inspection circuit is 2 mm, an example 5 is a case where the distance from the bending area to the inspection circuit is 3 mm, and an example 6 is a case where the distance from the bending area to the inspection circuit is 4 mm. FIG. 16 shows that the moisture concentration in the inspection circuit unit increases as time elapses regardless of the distance from the bending area to the inspection circuit unit. In addition, as shown in FIG. 16 and FIG. 17, as the distance from the bending area to the inspection circuit unit increased, the moisture concentration in the inspection circuit unit decreased. That is, experimental results confirm that the moisture in the inspection circuit unit is reduced when the path through which moisture moves from the bending area to the inspection circuit unit is increased by including the dummy pattern as in an embodiment.

Although specific embodiments have been described in detail above, the scope of the present invention as defined in the claims is not limited thereto, and various modifications and improvements are also within the scope of the invention as defined in the claims.

What is claimed is:

1. A display device, comprising:
a substrate including a display area and a non-display area, the substrate including a bend in the non-display area;
one or more moisture-sensitive components in the non-display area;
a dummy pattern unit in the non-display area, the dummy pattern unit being between the bend and the moisture-sensitive components; and
an inspection circuit unit positioned between the dummy pattern unit and the moisture-sensitive components.

2. The display device of claim 1, wherein:
in the display area, the display device further comprises
a semiconductor layer positioned on the substrate,
a first conductive layer including a gate electrode overlapping the semiconductor layer,
a second conductive layer including a drain electrode electrically connected to the semiconductor layer, and
a third conductive layer including a connection electrode electrically connected to the drain electrode.

3. The display device of claim 2, wherein:
the dummy pattern unit includes a first dummy pattern positioned on the same layer as the second conductive layer.

4. The display device of claim 3, wherein:
the dummy pattern unit includes a second dummy pattern positioned on the same layer as the third conductive layer.

5. The display device of claim 4, wherein:
edges of the first dummy pattern and the second dummy pattern are aligned.

6. The display device of claim 4, wherein:
section of the first dummy pattern and section of the second dummy pattern are alternately disposed in a plan view.

7. The display device of claim 2, further comprising:
a first insulating layer between the first conductive layer and the second conductive layer;
a second insulating layer between the second conductive layer and the third conductive layer; and
a third insulating layer on the third conductive layer.

8. The display device of claim 7, wherein:
the second insulating layer is recessed between sections of the first dummy pattern.

9. The display device of claim 7, wherein:

the third insulating layer is recessed between sections of the first dummy patterns.

10. The display device of claim 7, wherein:

the third insulating layer is recessed between sections of the second dummy pattern.

11. The display device of claim 7, wherein at least one of the second insulating layer and the third insulating layer comprises:

a first portion overlapping the dummy pattern unit and having a first thickness; and a second portion spaced apart from the dummy pattern unit and having a second thickness, the first thickness being smaller than the second thickness.

12. The display device of claim 2, wherein:

the inspection circuit unit includes a first inspection circuit unit including a static electricity discharge part.

13. The display device of claim 12, wherein:

the first inspection circuit unit includes a first static electricity discharge line and a second static electricity discharge line, and different voltages are applied to the first static electricity discharge line and the second static electricity discharge line.

14. The display device of claim 13, wherein:

the first static electricity discharge line and the second static electricity discharge line are positioned on the same layer as the second conductive layer.

15. The display device of claim 12, wherein:

the inspection circuit unit further comprises:

a second inspection circuit unit including a plurality of lighting lines; and a third inspection circuit including a plurality of crack detection lines.

16. The display device of claim 15, wherein:

the first inspection circuit unit, the second inspection circuit unit, and the third inspection circuit unit are positioned away from the display area in order.

17. The display device of claim 15, wherein:

the plurality of light lines and the plurality of crack detection lines are positioned on the same layer as the second conductive layer.

18. The display device of claim 1, wherein:

an organic insulating layer is positioned at an outermost portion of the bend in the substrate.

19. The display device of claim 1, wherein:

no voltage is applied to the dummy pattern unit.

20. The display device of claim 1, wherein:

the display area comprises a scan line extending in a first direction and a data line extending in a second direction; and the first dummy pattern and the second dummy pattern extend along the first direction.

* * * * *